(12) United States Patent
Deshi

(10) Patent No.: US 7,528,342 B2
(45) Date of Patent: May 5, 2009

(54) METHOD AND APPARATUS FOR VIA DRILLING AND SELECTIVE MATERIAL REMOVAL USING AN ULTRAFAST PULSE LASER

(75) Inventor: Tan Deshi, Wuhan (CN)

(73) Assignee: Laserfacturing, Inc., Burlington, Ontario (CA)

( * ) Notice: Subject to any disclaimer, the term of this patent is extended or adjusted under 35 U.S.C. 154(b) by 339 days.

(21) Appl. No.: 11/048,704

(22) Filed: Feb. 3, 2005

(65) Prior Publication Data

US 2006/0169677 A1    Aug. 3, 2006

(51) Int. Cl.
B23K 26/38    (2006.01)
B23K 26/06    (2006.01)

(52) U.S. Cl. ................................. 219/121.68

(58) Field of Classification Search ............ 219/121.68; 359/245, 246, 257, 264; 372/6
See application file for complete search history.

(56) References Cited

U.S. PATENT DOCUMENTS

| | | | |
|---|---|---|---|
| 3,758,199 A * | 9/1973 | Thaxter .................... 359/224 |
| 5,045,668 A * | 9/1991 | Neiheisel et al. ....... 219/121.83 |
| 5,760,880 A * | 6/1998 | Fan et al. .................... 355/67 |
| 5,917,179 A * | 6/1999 | Yao ............................ 359/245 |
| 6,049,407 A * | 4/2000 | Melville ..................... 359/198 |
| 6,552,301 B2 * | 4/2003 | Herman et al. ......... 219/121.68 |
| 6,555,781 B2 * | 4/2003 | Ngoi et al. ............. 219/121.68 |
| 6,574,250 B2 | 6/2003 | Sun et al. |
| 6,621,040 B1 | 9/2003 | Perry et al. |
| 6,631,558 B2 | 10/2003 | Burgess |
| 6,654,183 B2 * | 11/2003 | Coufal et al. ................ 359/717 |
| 6,677,552 B1 | 1/2004 | Tulloch et al. |
| 6,693,660 B2 * | 2/2004 | Hemmings ................... 347/252 |

(Continued)

FOREIGN PATENT DOCUMENTS

JP    10-277766    * 10/1998

(Continued)

OTHER PUBLICATIONS

Zayarnyuk et al., "Optical properties of potassium erbium double tungstate KEr(WO4)2", (2001)Proceedings of SPIE vol. 4412, pp. 280-283.*

(Continued)

*Primary Examiner*—Geoffrey S Evans
(74) *Attorney, Agent, or Firm*—Greenblum & Bernstein, P.L.C.

(57) ABSTRACT

A method and apparatus for selective material removal and via drilling for semiconductor applications using an ultrafast laser pulse directly from an ultrafast pulse laser oscillator without amplification are disclosed. The method and apparatus includes techniques to avoid/reduce the cumulative heating effect and to avoid machine quality degrading in multi shot ablation. Also the disclosed method and apparatus provide a technique to change the polarization state of the laser beam to reduce the focused spot size, and to improve the machining efficiency and quality. The disclosed method and apparatus provide a cost effective and stable system for high volume manufacturing and inspection applications. The disclosed method and apparatus have particular applications in, but not limited to, drilling vias for interconnect formation, selective material removal for application specific integrated circuits, selective material removal for flash memory applications, exposing layers for further semiconductor processing such as wire bonding etc. The ultrafast laser oscillator can be called a femtosecond laser oscillator or a picosecond laser oscillator depending on the pulse width of the laser beam generated.

38 Claims, 21 Drawing Sheets

U.S. PATENT DOCUMENTS

| | | |
|---|---|---|
| 6,714,289 B2 | 3/2004 | Haraguchi et al. |
| 7,706,997 | 3/2004 | Stucker |
| 6,720,519 B2 | 4/2004 | Liu et al. |
| 6,727,458 B2 | 4/2004 | Smart |
| 6,849,823 B2 * | 2/2005 | Edme et al. ............. 219/121.7 |
| 7,027,155 B2 * | 4/2006 | Cordingley et al. .... 219/121.78 |
| 7,116,688 B2 * | 10/2006 | Sauter et al. .................. 372/25 |
| 7,366,378 B2 * | 4/2008 | Jia et al. ....................... 385/37 |
| 2001/0031960 A1 * | 10/2001 | Kliewer et al. ................. 606/5 |
| 2002/0166845 A1 * | 11/2002 | Cordingley et al. .... 219/121.62 |
| 2004/0155017 A1 * | 8/2004 | Hunt et al. ............ 219/121.69 |
| 2005/0236380 A1 * | 10/2005 | Tsuno et al. ........... 219/121.61 |
| 2006/0151704 A1 * | 7/2006 | Cordingley .............. 250/358.1 |

FOREIGN PATENT DOCUMENTS

| | | | |
|---|---|---|---|
| JP | 2003-211400 A | * | 7/2003 |
| JP | 2004-358486 A | * | 12/2004 |

OTHER PUBLICATIONS

Carlslaw et al., "Conduction of heat in solids", pp. 256-258, Oxford University, London, 1959.

* cited by examiner

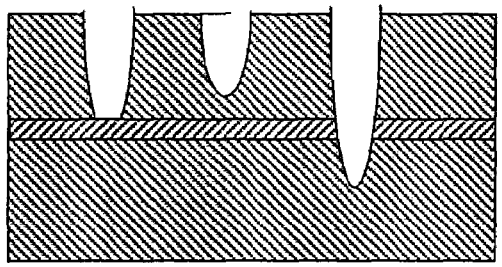

With nanosecond and amplified ultrafast laser system it is difficult to stop the ablation precisely at selected layer.

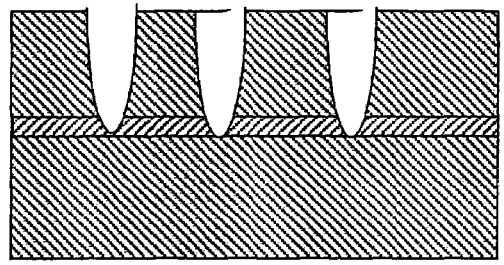

With the ultrafast laser system disclosed in this invention, one can control the ablation precisely at selected layer.

Figure 21

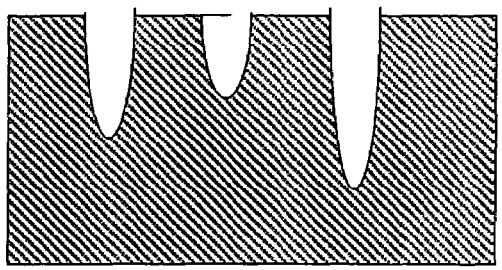

Poor via depth control with nanosecond and amplified ultrfast laser system laser. Error=±10%

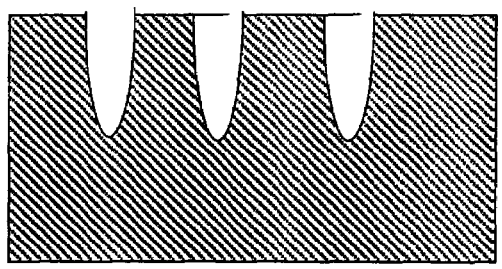

Via depth can be precisely controlled with ultrashort laser system disclosed in this invention. Error<±1%

Figure 22

METHOD AND APPARATUS FOR VIA DRILLING AND SELECTIVE MATERIAL REMOVAL USING AN ULTRAFAST PULSE LASER

BACKGROUND OF THE INVENTION

1. Field of the Invention

The present invention relates to a method and apparatus for via drilling and selective material removal using using an ultrafast pulse laser, and more specifically it relates to an apparatus and method for via drilling and selective material removal using an ultrafast pulse laser directly from an oscillator without an amplifier, operating in picosecond and femtosecond pulse width modes.

2. Description of the Related Art

Amplified short pulse lasers of pulse widths of 100 picosecond to 10 femtosecond are being used in general applications to overcome the problem of long pulse lasers. There are several advantages of short pulse lasers in comparison to long pulse lasers. For example, since the duration of short pulse laser is shorter than the heat dissipation time, the energy does not have the time to diffuse away and hence there is minimal or no heat affected zone and micro cracks. There is also negligible thermal conduction beyond the ablated region resulting in negligible stress or shock to the surrounding material.

Since there is minimal or no melt phase in short pulse laser processing, there is no splattering of material onto the surrounding surface. There is also no damage caused to the adjacent structure since no heat is transferred to the surrounding material. There are no undesirable changes in electrical or physical characteristic of the material surrounding the target material. There is no recast layer present along the laser cut side walls, and this is vital for semiconductor applications. Amplified short pulse lasers eliminate the need for any ancillary techniques to remove the recast material within the kerf or on the surface. The surface debris present does not bond with the substrate, and it is easily removed by conventional washing techniques.

Machined feature size can be significantly smaller than the focused laser spot size of the laser beam, and hence the feature size is not limited by the laser wavelength.

Short pulse lases can be broadly divided in to two categories. The first category is the femtosecond pulse with laser (ranging from 10 fs-1 ps), and the second category is the pico second pulse width laser (ranging from 1 ps-100 ps).

The femtosecond laser system (which is generally a Ti-sapphire laser) generally consists of a mode locked femtosecond oscillator module, which generates and delivers femtosecond laser pulse of in the order of nanojoule pulse energy and 10-200 MHz repletion rate. The low energy pulse is stretched in time prior to amplification. Generally the pulse is stretched to Pico second pulse width in a pulse stretcher module, using a dispersive optical device such as a grating. The resultant stretched beam is then amplified by several orders of magnitude in the amplifier module, which is commonly called as regenerative amplifier or optical parameter amplifier (OPA). The pump lasers generally used to pump the gain medium in the amplifier are Q-switched Neodymium-yttrium-lithium-floride (Nd-YLF) laser or Nd: YAG laser with the help of diode pump laser or flash lamp type pumping. The repletion rate of the system is determined by the repletion rate of the pump laser. Alternatively if continuous pumping is used then the repetition rate of the system is determined by the optical switching within the regenerative amplifier. The resultant amplified laser pulse is of Ps pulse width is compressed to femtosecond pulse width in a compressor module. By this means femtosecond pulse of mille joules to micro joules of pulse energy of repletion rate 300 KHz to 500 Hz and average power less than 5 W are produced.

The amplified femtosecond pulse has been used widely for micro machining applications as described in U.S. Pat. Nos. 6,720,519, 6,621,040, 6,727,458 and 6,677,552. The amplified femtosecond pulse, however, suffers from limitations, which prevents it from being employed in high volume manufacturing industrial applications. The system is relatively unstable in terms of laser power and laser pointing stability. Laser stability is very essential in obtaining uniform machining quality (ablated feature size) over the entire scan field. The average laser power is relatively low to meet the industrial throughput requirements. The Amplified femtosecond laser technology is relatively expensive, which increases manufacturing costs considerably. The down time of the system is high due to the complexity of the laser system. The laser system requires relatively large floor space. There are relatively poor feature size and depth controllability due to laser power fluctuation. Experienced and trained professionals are required for the maintenance of the system.

In contrast, an amplified picosecond laser system has a pico second oscillator, which delivers picosecond laser of nanojoules pulse energy and is amplified by a amplifier. The pump lasers generally used to pump the gain medium in the amplifier are Q-switched Neodymium-yttrium-lithium-floride (Nd-YLF) laser or Nd:YAG laser with the help of diode pump laser or flash lamp type pumping. The repletion rate of the system is determined by the repletion rate of the pump laser. Alternatively if continuous pumping is used then the repetition rate of the system is determined by the optical switching within the regenerative amplifier. The resultant amplified pulse has repletion rate ranging from 500 Hz to 300 KHz of average power 1 to 10 W. Although the amplified picosecond laser is simple and compact in comparison to the amplified femtosecond laser, it has, however, several limitations, which prevents it from being used for high volume manufacturing applications in industry.

The Amplified picosecond laser is more stable than an amplified femtosecond laser system, but it is still unstable in terms of laser power and laser pointing stability to meet the needs for industrial high volume manufacturing applications. Laser stability is very essential in obtaining uniform machining quality (sblated feature size) over the entire scan field. The Amplified picosecond femtosecond laser technology is also cheaper than amplified femtosecond laser system, but it is still expensive, which increases manufacturing costs considerably. It also has relatively poor feature size and depth controllability due to laser power fluctuation. The down time of the system is relatively high, and the laser system requires relatively large floor space. Experienced and trained professionals are required for the maintenance of the system Femtosecond laser with very low fluency is a promising machining tool for direct ablating of sub-micron structures. Fundamental pulses emitting from oscillator can be used to create nano-features. But due to short time gap between the successive pulses, there is considerable degrading of the machining quality, which is explained below.

At the end of the irradiation of an individual laser pulse, surface temperature rises to $T_{max}$. Due to thermal diffusion, the surface temperature decays slowly and eventually reduces to the environment temperature $T_0$. The time span of the thermal diffusion $\tau_{diffusion}$ can be determined by the one-dimensional homogeneous thermal diffusion equation. In the case of multi-shot ablation, if the successive pulse arrives before $\tau_{diffusion}$ ($t<\tau_{diffusion}$), the uncompleted heat dissipation will enhance the environment temperature. The environment temperature after n laser shots for a pulse separation of t at a time just before the next (or (n+1)th) shot can be expressed by $$T_0(n)=T_0+n\delta T,$$

where, δT is the temperature rise due to un-dissipated heat at the end of a pulse temporal separation.

The actual surface temperature $T_{max}(n)$ after n successive pulses can be written as:

$$T_{max}(n)=T_0(n)+T_{max}$$

The enhanced surface temperature of the ablation front will cause over heating and deteriorate the quality of ablation. In the case of via drilling application, such over heating deteriorate the geometry of via, causing barrel at the bottom of the hole.

The longer the time between successive pulses, the less is the effect of the thermal coupling enhancing the surface temperature. When pulse separation t is long enough that the heat diffusion outranges the thermal coupling, the machining quality of multi-shot ablation will be as good as that of single-shot ablation.

In fact, thermal coupling effect of multi-shot ablation was observed not only for nano-second pulses but also for ultrafast laser pulses. Fuerbach [1], reported that to avoid degrading of machine precision due to heat accumulating 1 μs pulse separation should be given for femtosecond pulses ablation of glass.

If pulse to pulse separation time is less than the relaxation time/diffusion time of the ablated material, there is a cumulative heating effect as described above. By this process the subsequent pulses arrive before the sample surface dissipate the heat generated by the previous pulse and relax to the state of the underlying bulk material. These effect due to heat accumulation increases with the increase in the pulse width, say from 1 fs to 100 ps. Also machining with ultrafast pulse laser directly from oscillator, the feature quality is degraded. There are several drawbacks related to the cumulative heating effects. It is difficult use such a system for nanoscale maching applications due to heat accumulation, and hence there is broadening of the feature at the focused spot. The surrounding area will be damaged due to heat accumulation, which is not accepted in many semiconductor applications. There is more debris inside and around the ablated feature, possibly resulting in considerable post processing. A barrel shape may form at the bottom of the hole in via drilling applications. There is relatively poor quality associate with the ablated feature. Accordingly, there is a need for overcoming the effect of cumulative heating, and such a technique is disclosed in the present patent application.

Drilling Interconnect Via:

In recent years, demands for higher speed and smaller chips have resulted in more complex chips having millions of interconnections. Micro-vias are used to configure multilevel and multilayer structures and integrate the components on microprocessor, gate array, or high speed computer chip. On-chip and chip-to-chip interconnections play the most significant role in determining the size, power consumption, speed, reliability and clock frequency and yield of circuit. The solution for future IC packaging is 3D IC stacking using through chip interconnects. A 3D IC is a stack of multiple dies with many direct connections tunneling through them, dramatically reducing global interconnect lengths and increasing the number of transistors that are within one clock cycle of each other. Drilling interconnect via (in Si ICs and Si interposer) are increasingly important in various applications such as laying ground plane on the back side, provision for an optical interconnect, chip scale packaging etc. After drilling via, they are coated with a layer of insulating material before the conductive material, typically copper, is deposited to make the wire. One way of producing interconnect via is by plasma etch equipment in conjunction with photolithography process. But the technique is very expensive and very slow to meet the industrial need. The fastest growing emerging tool for micro via formation is laser drilling using solid state Nd:YAG UV laser. UV wavelength in the range of 248 to 355 nm is absorbed by most materials used in IC and semiconductor fabrication. Via of 25 μm diameter can be easily achieved with UV laser.

Interconnect vias, however, fabricated with a nanosecond pulse laser as described in patents U.S. Pat. Nos. 6,631,558, 6,706,997 etc. suffer from limitations. These limitations include micro cracks, and a recast layer along the via sidewalls. It also relatively difficult to selectively drill through a layer without damaging the underlying layer, which is demanded in most interconnect via applications. It is also relatively difficult to remove surface debris due to molten material ejection from the via hole by post process cleaning. This technique cannot generate via holes in the submicron range, which is demanded by current and future integrated circuits. It also causes damage to adjacent structure due to heat dissipation. There is relatively poor via depth control which is critical in interconnect via fabrication. There is also relatively poor repeatability of via holes in terms of diameter and depth. Lastly, there is relatively poor via shape due to laser plasma shielding

SUMMARY OF THE INVENTION

One object of the present invention is to provide an improved method and apparatus for micro/nano machining and to ameliorate the aforesaid deficiencies of the prior art by using an ultrafast pulse generated directly from the laser oscillator. The laser oscillators preferably include a mode locked diode pumped solid state laser system, which is stable and compact. The pulse laser beam preferably has a pulse width of 1 fs to 100 ps and a repletion rate from 1 MHz to 400 MHz, and it is controlled by an electro optic modulator or an acousto optic modulator.

The modulated pulse is expanded to the required beam diameter by using a combination of positive and negative lens to act as a telescope. By varying the diameter of the laser beam, the focused laser spot size can be varied. The pulsed laser beam is preferably scanned by a two axis galvanometer scanner to scan the pulse laser beam on the surface of the work piece in a predetermined pattern. The scanning beam can be focused on a work piece using a focusing unit or lens, which is preferably a scanning lens, telecentric lens, F-θ lens, or the like, positioned a distance from the scanning mirror approximately equal to the front focal length (forward working distance) of the focusing lens. The work piece is preferably positioned at approximately the back focal length (back working distance) of the focusing lens.

In another aspect of the invention, the modulator controls the laser pulse to minimize the cumulative heating effect and to improve the machining quality. In addition to pulse control the modulator controls the pulse energy and function as a shutter to on and off the laser pulse when required.

In another aspect of the invention, the cumulative heating effect can be minimized or eliminated by using a gas or liquid assist. Due to the cooling effect of the assisted gas or liquid, it is possible to minimize the cumulative heating effect even at a relatively high repletion rate. Also the machining quality and efficiency of processing are improved by using assisted gas or liquid.

In another aspect of the invention, the cumulative heating effect, quality of the machined feature and efficiency of the process also depends on the scanning speed of the laser. The scanning speed is controlled depending on the repletion rate of the laser beam, the ablated feature size and the type of gas or liquid assist used.

In another aspect of present invention, it is possible to produce feature sizes of less than one twentieth of the focused spot size of the ultrafast pulse laser beam. This can be achieved by precisely controlling the laser threshold fluence slightly above the ablation threshold of the material and by precisely controlling the number of pulses and the duration between the pulses (minimizing or eliminating the cumulative heating effect) using the pulse modulation means disclosed in the present application. In addition the stability of the laser pulse from the ultrafast laser oscillator plays a vital role in machining feature of desired size with repeatability and precision.

In another aspect of the present invention, a polarization conversion module is used to vary the polarization state of the laser beam along the axis. The modules uses a combination of a telescopic arrangement with a retardation plate or birefringent material in-between them. The resultant polarization state of the beam can be a partially or fully radial polarization state. This enables reduced focused spot size and improvement in the cutting efficiency and quality compared to linear and circularly polarized laser beams.

In another aspect of the present invention a piezo scanner is used for scanning the laser beam in two axes rather than a galvanometer scanner. This eliminates the distortion created at the image field due to common pivot point of scanning on two axes. Also the position accuracy and resolution is enhanced.

In another aspect of the present invention, a beam shaping module is introduced to change the profile of the laser beam to the desired profile using a combination of a MDT element and a quarter wave plate. By carefully selecting the beam diameter and the length of the MDT element the beam profile is varied for selective material removal and via drilling application.

In another aspect of the present invention, the pulse energy plays a vital role in micro and nano processing with high quality. The pulse energy required to ablate a feature depends on the depth of ablation, repeatability of feature size required and the feature quality. The maximum depth that can be generated for a given focused spot size of the laser beam depends on the pulse energy. As the ablated feature becomes deeper it is difficult to remove the ablated material from the hole and hence the ablated material absorbs the energy of the subsequent pulse. Also the uncertainty in the feature size obtained will depend upon the number of pulses required to ablate the required feature. Due to the topography generated and debris deposited in the crater by the ablation of the first pulse the absorption of the successive pulses is different due to the defects generated in the previous pulse, scattering of the laser beam etc. Due to the above mechanism, the ablation threshold of the successive pulses may vary. The uncertainty in the diameter of ablated feature increases with an increase in the number of pulses. Also, higher pulse energy generates sufficient pressure for ejecting the debris out of the carter and hence the successive pulse will interact with the fresh substrate. This results in improved top surface and inner wall quality of the ablated feature. Hence it is advantageous to use higher pulse energy and a lower number of pulses to ablate a required feature.

In another aspect of the invention, the effect of wavelength on the cutting efficiency and stability of micron and nano processing using laser pulses from an ultrafast laser oscillator is disclosed. In ultrafast laser processing the wavelength of the laser beam does not have a major impact on the threshold fluence of the material as in the case of short pulse ablation in micron and nanosecond pulse width techniques. Due to high peak power of the laser caused by a short pulse width, the protons generated by the laser beam start the ablation process rather than the protons generated from the substrate. Hence absorption of the material at different wavelength does not have a major influence in its threshold fluence. Hence a laser beam having the fundamental frequency will have a higher cutting efficiency than the second harmonic frequency for a given focused spot size due to the higher average power from the ultrafast laser oscillator at the fundamental laser frequency. Similarly, the laser beam having the second harmonic frequency will have a higher cutting efficiency compared to a third harmonic frequency due to the greater average power from the ultrafast laser oscillator at the second harmonic frequency. Also the stability of the laser beam will deteriorate with the reduction in wavelength by frequency doubling and tripling, due to the increase in the optical components and the sensitivity of the frequency doubling and tripling crystal and to environmental factors such as temperature. Hence repeatability in feature size and position accuracy may deteriorate compared to the fundamental frequency from the ultrafast laser oscillator by frequency doubling and tripling. Also the cost of the system may be increased by frequency doubling and tripling due to the addition of more optical components. In spite of the drawbacks of using frequency doubled and tripled laser pulse, some applications may demand the use of a shorter wavelength to achieve smaller feature size and in sensitive material processing.

The method and apparatus of the present invention can be utilized for selective removal of material using ultrafast laser pulses directly from the oscillator. In ultrafast laser processing, the threshold fluence of the material is clearly defined and hence by controlling the pulsed laser fluence, material with a lower threshold fluence can be selectively removed without ablating the underlying material of higher threshold fluence.

In addition, the method and apparatus of the present invention can be utilized for drilling interconnect vias on multi-layer printed circuit boards or semiconductor wafers by using ultrafast pulses generated directly from the laser oscillator.

The blind via holes are drilled through insulator layer and conductive plate/layer causing minimal or no damage to the underlying conductive layer. The insulating layer can be dielectric, glass or any other insulating material. A via has a smaller diameter at the lower portion of the via compared to the upper portion. Via sidewall angles may range from 89 degrees to 1 degree depending on the depth and diameter of the via (top and bottom via diameter required). Via interconnects are then formed by filling via holes formed between conductive layers/plane with conductive material. Sidewall angle is very critical for filling via holes with conductive material without voids. In laser processing as the depth of the via channel increases, barrel shape channels are formed. These barrel shape holes results in voids when filling the holes with conductive material, and it is not acceptable for the formation of an interconnect. This barrel formation can be avoided by the method and apparatus disclosed in the present application. The number of layers though which via hole is drilled can vary depending on the application. The method and apparatus disclosed herein can be used to produce both round and slotted blind vias of single and multiple depths.

BRIEF DESCRIPTION OF THE DRAWING

FIG. 21 is an illustration showing the difficulty in stopping the ablation precisely at selected layer using nanosecond and amplified ultrafast laser compared to the ultrafast laser system disclosed in the present application.

FIG. 22 is an illustration showing the poor repeatability of via holes formed by nanosecond laser and amplified ultrafast laser compared to the high repeatability of via holes formed by the ultrafast laser system disclosed in this application.

DETAIL DESCRIPTION OF THE DRAWING

Figure 1:
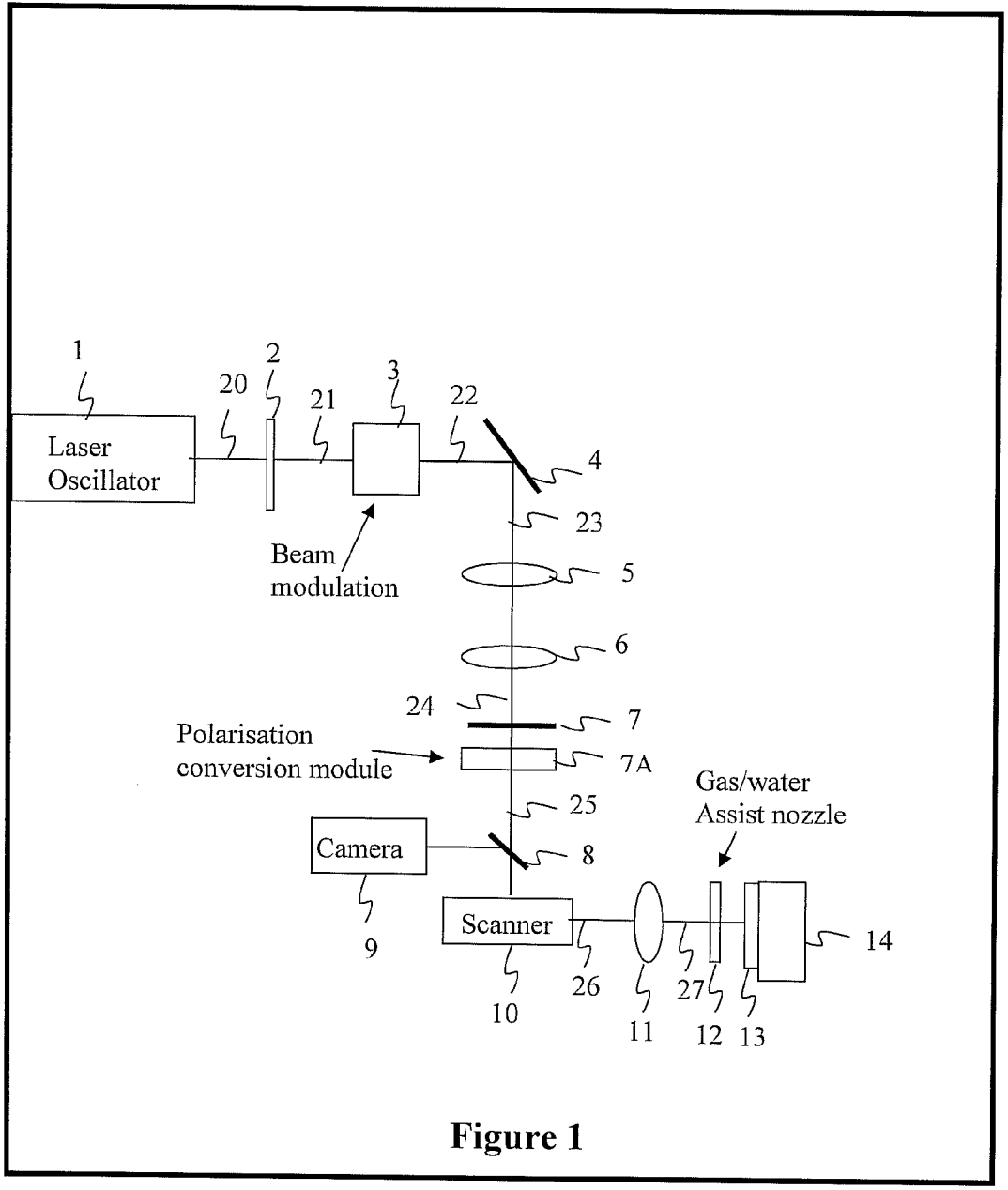
FIG. 1 is an illustration showing the laser apparatus for micro and nano processing using ultrafast laser pulse from the oscillator.

One object of the present invention is to provide an improved method and apparatus for micro/nano machining and to ameliorate the aforesaid deficiencies of the prior art by using an ultrafast pulse generated directly from a laser oscillator. The laser oscillators preferably include a mode locked diode pumped solid state laser system, which is stable and compact. The pulse laser beam preferably has a pulse width of 1 fs to 100 ps and a repletion rate from 1 MHz to 400 MHz, and it is preferably controlled by an electro optic modulator or an acousto optic modulator.

The modulated pulse is expanded to the required beam diameter by using a combination of positive and negative lens to act as a telescope. By varying the diameter of the laser beam the focused laser spot size can be varied. The pulsed laser beam is preferably scanned by a two axis galvanometer scanner in order to scan the pulse laser beam on the surface of the work piece in a predetermined pattern. The scanning beam can be focused on a work piece using a focusing unit or lens, which is preferably a scanning lens, telecentic lens, F-θ lens, or the like, positioned a distance from the scanning mirror approximately equal to the front focal length (forward working distance) of the focusing lens. The work piece is preferably positioned at approximately the back focal length (back working distance) of the focusing lens.

The modulator controls the laser pulse to minimize the cumulative heating effect and to improve the machining quality. In addition to pulse control, the modulator controls the pulse energy and functions as a shutter to turn on and off the laser pulse when required.

The cumulative heating effect can be minimized or eliminated by using a gas or liquid assist. Due to the cooling effect of the assisted gas or liquid, it is possible to minimize the cumulative heating effect even at a relatively high repletion rate. Also the machining quality and efficiency of processing are improved by using assisted gas or liquid.

The cumulative heating effect, quality of the machined feature and efficiency of the process also depends on the scanning speed of the laser. The scanning speed is controlled depending on the repletion rate of the laser beam, the ablated feature size and the type of gas or liquid assist used.

In another aspect of the present invention, a polarization conversion module is used to vary the polarization state of the laser beam along the axis. The module uses a combination of a telescopic arrangement with a retardation plate or birefringent material in-between them. The resultant polarization state of the beam can be a partially or fully radial polarization state. This enables reduced focused spot size and improvement in the cutting efficiency and quality compared to linear and circularly polarized laser beams.

In another aspect of the present invention a piezo scanner is used for scanning the laser beam in two axes rather than a galvanometer scanner. This eliminates the distortion created at the image field due to a common pivot point for scanning on two axes. Also the position accuracy and resolution are enhanced.

In another aspect of the present invention, a beam shaping module is introduced to change the profile of the laser beam to the desired profile using a combination of a MDT element and a quarter wave plate. By carefully selecting the beam diameter and the length of the MDT element, the beam profile is varied for selective material removal and via drilling applications.

In addition, the present invention is capable of producing a feature size of less than one twentieth of the focused spot size of the ultrafast pulse laser beam. This can be achieved by precisely controlling the laser threshold fluence slightly above the ablation threshold of the material and by precisely controlling the number of pulses and the duration between the pulses (minimizing or eliminating the cumulative heating effect) using the pulse modulation means disclosed in this application. In addition, the stability of the laser pulse from the ultrafast laser oscillator plays a vital role in machining a feature of a desired size with repeatability and precision.

In addition, the present application discloses pulse energy that plays a vital role in micro and nano processing with high quality. The pulse energy required to ablate a feature depends on the depth of ablation, repeatability of the feature size required and the feature quality. The maximum depth that can be generated for a given focused spot size of the laser beam depends on the pulse energy. As the ablated feature becomes deeper, it is difficult to remove the ablated material from the hole and hence the ablated material absorbs the energy of the subsequent pulse. Also the uncertainty in the feature size obtained will depend on the number of pulses required to ablate the required feature. Due to the topography generated and debris deposited in the crater by the ablation of the first pulse, the absorption of the successive pulse is different due to the defects generated by the previous pulse, scattering of the laser beam etc. Due to the above mechanism the ablation threshold of the successive pulse may vary. The uncertainty in the diameter of ablated feature increases with an increase in the number of pulses. Also, higher pulse energy generates sufficient pressure for ejecting the debris out of the carter and hence the successive pulse will interact with the fresh substrate. This results in an improved top surface and inner wall quality of the ablated feature. Hence it is advantageous to use higher pulse energy and a lower number of pulses to ablate a required feature.

The present application discloses the effect of wavelength on the cutting efficiency and the stability of micron and nano processing using laser pulses from an ultrafast laser oscillator. In ultrafast laser processing, the wavelength of the laser beam does not have a major impact on the threshold fluence of the material, as in the case of short pulse ablation in micron and nanosecond pulse widths. Due to the high peak power of the laser caused by short pulse widths, the protons are generated by the laser beam to start the ablation process rather than being generated from the substrate. Hence absorption of the material at different wavelengths does not have a major influence in its threshold fluence. Hence a laser beam having the fundamental frequency will have a higher cutting efficiency than the second harmonic frequency for a given focused spot size due to the higher average power from the ultrafast laser oscillator at the fundamental laser frequency.

Similarly, the laser beam having the second harmonic frequency will have a higher cutting efficiency compared to a third harmonic frequency due to the greater average power from the ultrafast laser oscillator at the second harmonic frequency. Also the stability of the laser beam will deteriorate with the reduction in wavelength by frequency doubling and tripling, due to an increase in the optical components and the sensitivity of the frequency doubling and tripling crystal due to environmental factors such as temperature. Hence repeatability in feature size and position accuracy may deteriorate compared to the fundamental frequency from the ultrafast laser oscillator by frequency doubling and tripling. Also the cost of the system may increase by frequency doubling and tripling due to the addition of more optical components. In spite of the drawbacks of using frequency doubled and tripled laser pulse, some applications may demand the use of shorter wavelengths to achieve smaller feature size and in sensitive material processing.

The method and apparatus of the present invention can be utilized for selective remove material using ultrafast laser pulses directly from the oscillator. In ultrafast laser processing the threshold fluence of the material is clearly defined and hence by controlling the pulsed laser fluence, material with a lower threshold fluence can be selectively removed without ablating the underlying material of the higher threshold fluence.

In addition, the method and apparatus of the present invention can be utilized for drilling an interconnect via on multilayer printed circuit boards or semiconductor wafers by using an ultrafast pulse generated directly from the laser oscillator.

The blind via holes are drilled through an insulator layer and a conductive plate/layer causing minimal or no damage to the underlying conductive layer. The insulating layer can be dielectric, glass or any other insulating material. A via has a smaller diameter at the lower portion of the via compared to the upper portion. Via sidewall angles may range from 89 degrees to 1 degree depending on the depth and diameter of via (top and bottom via diameter required). Via interconnects are then formed by filling the via holes formed between conductive layers/plane with conductive material. Sidewall angle is very critical for filling via holes with conductive material without voids. In laser processing as the depth of the via channel increases, a barrel shape channel is formed. These barrel shape holes results in voids when filling the holes with conductive material, and it is not acceptable for the formation of interconnect. This barrel formation can be avoided by the method and apparatus disclosed in the present application. The number of layers though which a via hole is drilled can vary depending on the application. The method and invention disclosed in the present application can be used to produce both round and slotted blind vias of single and multiple depths.

Exemplary embodiments of the present invention will now be described in greater detail in reference to the figures.

One embodiment of the present invention is the method and apparatus for micron and nano processing using ultrafast laser pulse directly from the laser oscillator. The ultrafast laser oscillator 1 generates laser pulse of a pulse width of 1 fs-100 ps. The laser pulse is preferably of the wavelength 1200-233 nm, and the repletion rate is preferably from 1 MHz to 400 MHz. Also the laser beam is collimated and of a linear or circular polarization state. The laser beam 20 incidents substantially normally on a wave plate 2, which is preferably a half wave or a quarter wave plate to change the polarization state of the incident laser beam 20. The laser pulse 21 is modulated by beam modulating means 3. The modulated laser pulse 22 is deflected by a mirror 4. The laser beam 23 is expanded or reduced in beam diameter by the optical lens 5 and 6, which are arranged and are of the keplerian telescope type (where optical lens 5 and 6 are positive lens) or Galilean telescope type (where optical lens 5 is a negative lens and optical lens 6 is a positive lens for beam size expansion or vice versa for beam size reduction).

The expanded laser beam 24 is passed through a diaphragm 7 to cut the edge of the Gaussian beam and to improve the quality of the pulsed laser beam. The laser beam 25 is scanned in X and Y axes by a two axis galvanometer scanner 10 after passing through a mirror or polarizer 8. Camera 9 images the work piece through polarizer 8, to align the work piece to the laser beam and to monitor the machining process. The laser beam 26 from the galvanometer scanner 10 is focused by an optical lens 11, which is preferably a telecentric lens or f-theta lens or scan lens or confocal microscopy lens. The lens 11 is positioned at the forward working distance from the center of the two scanning mirrors in the galvanometer scanner 10. The work piece/substrate 13 is placed at a distance equal to the back working distance of the lens 11 from the back face/out put of the lens 11. A gas assist system comprising of one or more nozzles is positioned close to the work piece/substrate 13. Preferably the work piece/substrate 13 is placed on a three axis mechanical translational stage 14. The translational stage 14 translates with respect to the laser beam 27 during and after laser dicing of an area defined by a field of view of the scanning lens.

During the micro and nano processing using ultrafast laser pulse directly from oscillator, the laser beam 27 may be focused on the top surface of the substrate/wafer 13 or located inside the bulk of substrate material between the top and bottom surface of the substrate 13. The location of the focus of the beam 27 depends on the thickness of the substrate/wafer 13. When the material is thicker, the focus of the laser beam 27 is further inside the bulk of the substrate, away from the top surface of the substrate.

Depending on the pulse energy of the laser beam 27 from the ultrafast laser oscillator 1 and the thickness of the substrate/wafer 13, the laser beam 23 is expanded or reduced, thus varying the energy density of the laser beam at the focused spot. When the laser beam 23 is expanded in beam diameter, using combination of optical lens 5 and 6, the focused spot size reduces and hence increases the energy density at the focused laser spot. Alternatively, when the laser beam 23 is reduced in beam diameter, using the combination of optical lens 5 and 6, the focused spot size increases and thereby reducing the energy density at the focused laser spot.

The laser oscillator 1 generates a laser pulse of a pulse width of 1 fs to 100 ps and a pulse repletion rate from 1 MHz to 400 MHz. The fundamental wavelength of the laser beam ranges from 1200 nm to 700 nm, second harmonic wave length 600 nm-350 nm and third harmonics from 400 nm to 233 nm. The pulse energy generated from this oscillator depends on the repetition rate of the system, and a higher repletion rate will lower the pulse energy and vice versa. Generally the average power of the laser from the oscillator will be 0.2 W-30 W depending on the pulse width and wavelength of the laser. A laser with a pulse width of 1 fs to 200 fs will have an average power of 0.2 W to 10 W depending on the pump laser power. Some of the commercially available femtosecond mode locked diode pump solid state oscillators are manufactured by Coherent Vitesse, Coherent Chameleon, Femtosource Scientific XL, Spectra Physics Mai-Tai etc. Similarly, a laser with a pulse width of 1 ps-100 ps has an average power of 1 W-30 W at the fundamental wavelength depending on the pump laser power. Some of the commercially available picosecond mode locked diode pump solid state oscillators include Coherent paladin, Time Bandwidth Cheetah-X, Time Bandwidth Cougar, Lumera laser UPL-20.

Since the oscillator operates on diode pumped solid state technology and involves minimal optical components, the system is highly stable for industrial high volume manufacturing applications. In ultrafast laser processing, the ablated feature size/machined feature size depends on the energy stability/noise of the laser. Based on Gaussian profile, for every 1% fluctuation in the laser fluence/laser energy there will be 16% fluctuation in the ablated/machined feature size in ultrafast laser processing. Most industrial applications, however, demand strict feature size control within 1-5%. Also pointing stability becomes a relatively critical issue for machining a feature in micron and nano scale industrial applications. This stringent industrial requirement can be met by using a laser pulse directly from an ultrafast laser oscillator.

Hence, using a laser pulse directly from an ultrafast laser oscillator for micro/nano processing makes the ultrafast laser technology viable for high volume manufacturing industrial applications due to the following reasons. The system is stable in terms of laser power and pulse to pulse energy due to Diode Pump Solid State (DPSS) laser technology and minimal optical components. The laser stability and the pulse to pulse energy stability are critical in controlling and obtaining repeatability in the ablated feature size. Good laser pointing stability is provide by DPSS laser technology. Good beam quality is essential for micro/nano processing. The laser power is high enough to meet the industrial throughput in micro/nano processing application. The system is simple and cost effective and reduces the manufacturing cost considerably. There is a low cost of ownership due to efficient DPSS technology. The down time of the system is relatively low. A relatively small floor space is required for the laser system In spite of the salient features mentioned above, micro/nano processing by using laser pulse directly from ultrafast laser oscillators limited due to several reasons. The cumulative heating effect which results in poor machining quality. There is an absence of a shutter mechanism to turn on and off the laser at high speed. There is also an absence of means for controlling the pulse energy.

To avoid surface modification around the structure which one actually wants to generate, thermal diffusion of the heat flowing out of the focal volume must overcome the deposited laser energy. In this case, there is no temperature raise around the focal area and hence no cumulative heating effect is expected. Thus in order to minimize the cumulative heating effect in multi shot ablation, the pulse separation time t should be long enough that the heat diffusion outranges the thermal coupling. Following are some of the means for minimizing the cumulative heating effect and for improving machining quality which are disclosed in the present application. One technique is to control the laser pulse from the ultrafast laser oscillator. Another is to use gas assisted ablation. Still another is to scan the laser beam at a rate at which each laser pulse irradiates at a different spot.

These techniques ensure that the machining precision after many laser shots does not degrade in comparison to single pulse damage spot.

Controlling the Laser Pulse from the Ultrafast Laser Oscillator:

Alternatively, the repetition rate can be reduced by increasing the resonator length, and hence a repletion rate as low as 5 MHz-10 MHz can be realized by increasing the resonator length. By reducing the pulse repetition rate the pulse energy can be increased, which increases the range of material that can be ablated and the feature size. The pulse energy, out of the mode locked oscillator can be calculated by Ep=PA/R, where Ep is the pulse energy, PA is the average power and R, repetition rate of the system.

To completely eliminate the cumulative heating effect and to improve the ablated feature quality, however, the repletion rate should be reduced to less than 1 MHz, which means a resonator cavity length of 150 m, which is difficult to realize. In order to further reduce the repletion rate some external pulse control means should be used. Also the pulse control means eliminates the need for a shutter and pulse energy control mechanism.

Two types of pulse control means namely electro optic and acousto optic modulation system are disclosed in the present application to perform control of the repletion rate and control of the pulse energy, and to operate as a laser shutter to turn on and off the laser output when required.

Controlling the Laser Pulse by Electro Optic Modulator:

Depending on the application, the electro optic modulator is known as pockels cells or a Q-switch or a pulse picker. The electro optic modulator is used in combination with a polarizing beam splitter or polarizer or prism for controlling the laser pulse. For efficient pulse control, the electro optic modulator preferably has a short rise time in the range of 20 ns to 10 ps, an energy/power loss less than 10%, and a clear aperture diameter of 2-10 mm.

Figure 2:
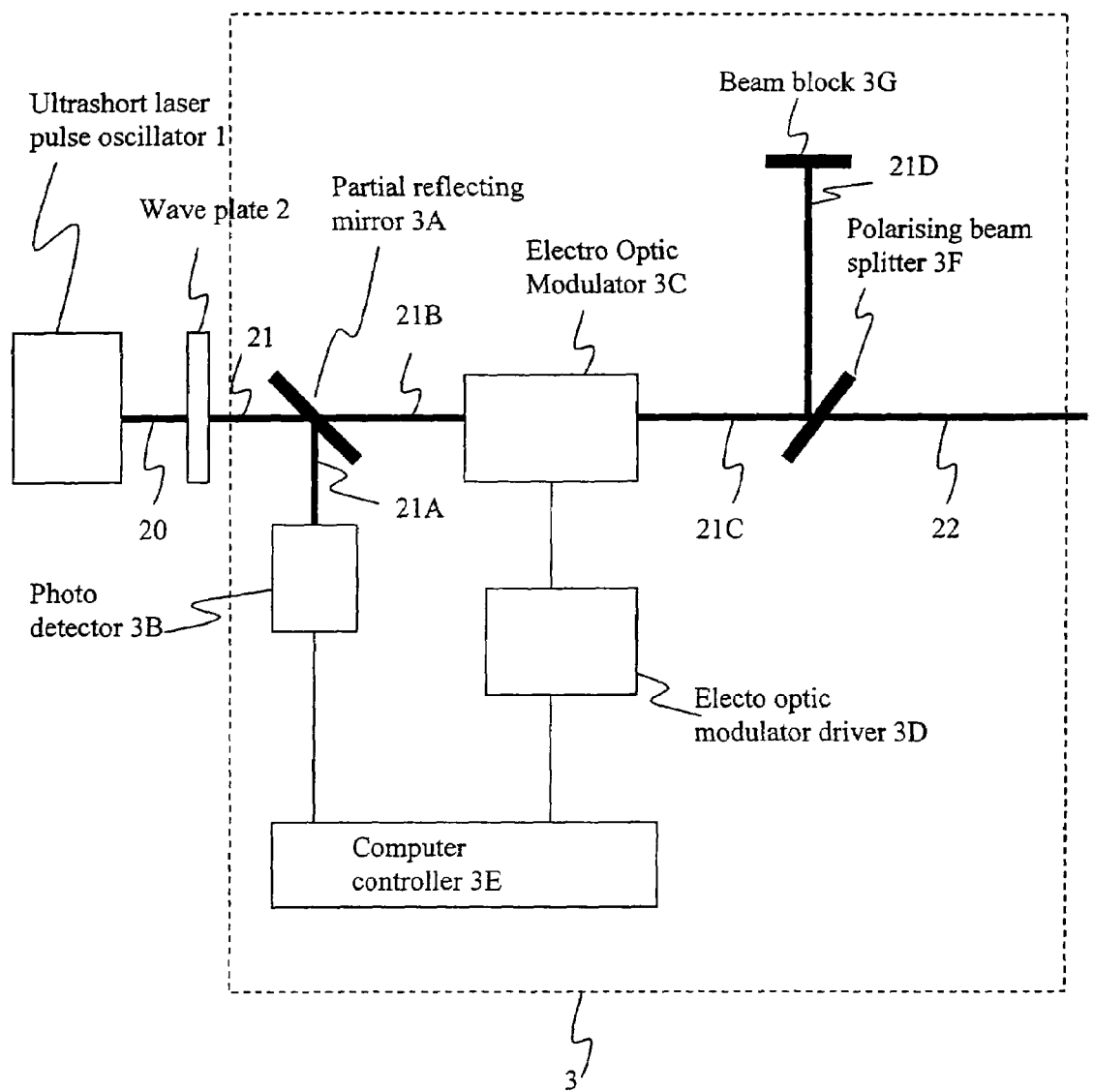
FIG. 2 is an illustration showing the apparatus to modulate the ultrafast laser pulse from the oscillator using electro optic modulator.
Figure 3:
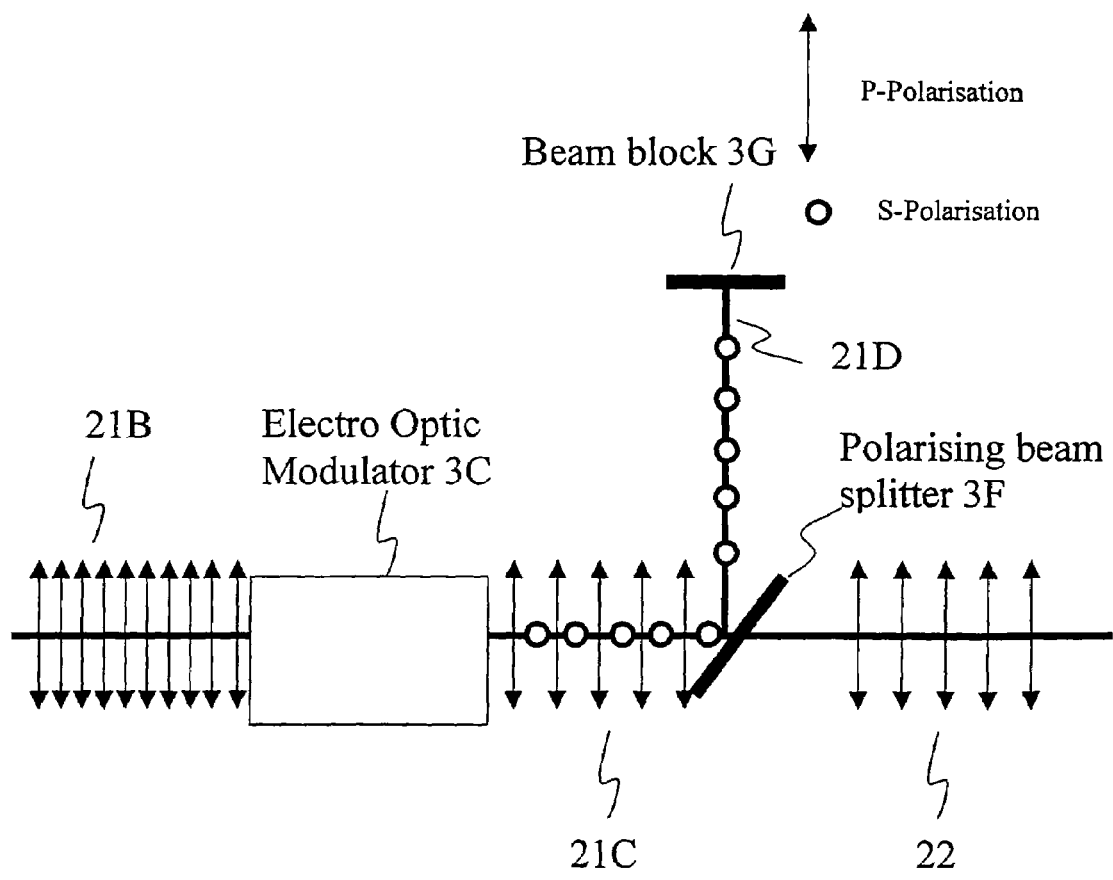
FIG. 3 is an illustration showing the mechanism of eliminating the successive ultrafast laser pulse to reduce the repetition rate by using electro optic modulator.
Figure 4:
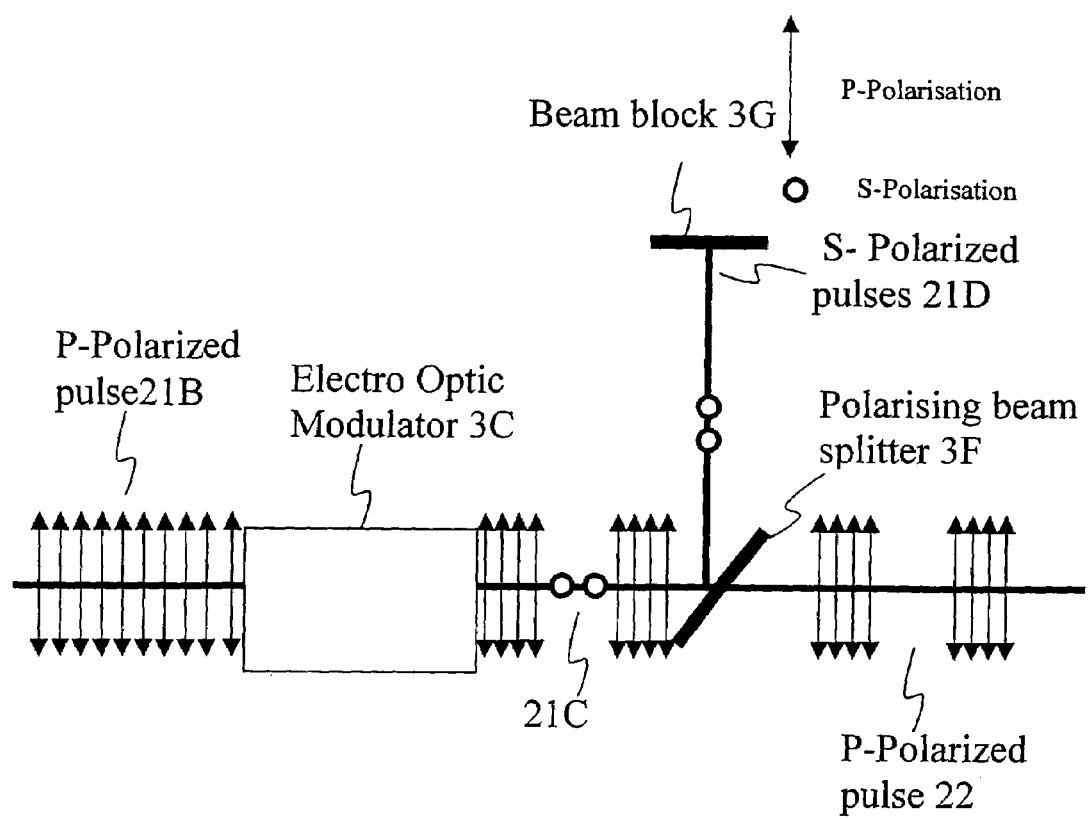
FIG. 4 is an illustration showing the introduction of a time gap between groups of laser pulses using an electro optic modulator.
Figure 5:
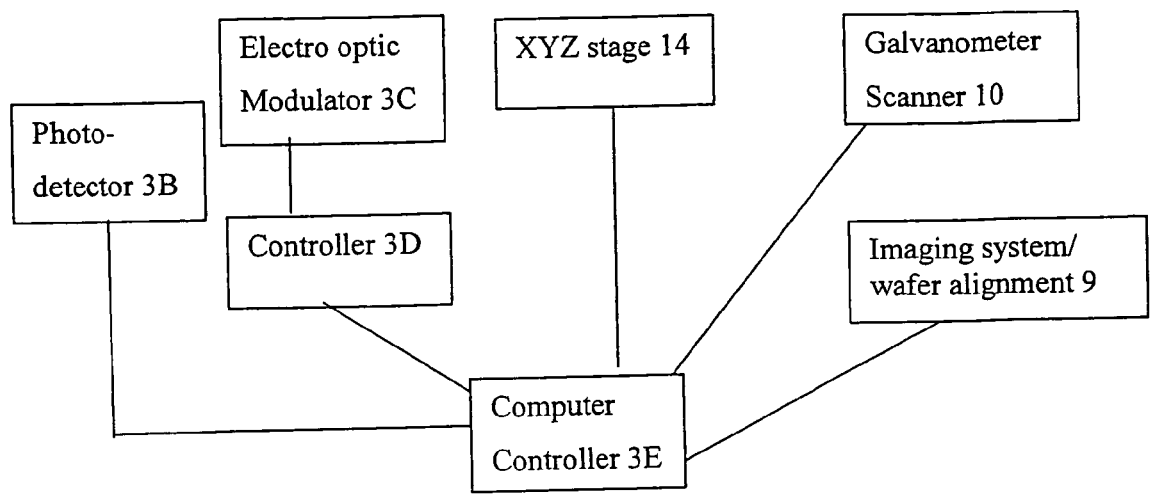
FIG. 5 is an illustration showing the control mechanism including a photo detector, electro optic modulator, XYZ translation stage, galvanometer scanner and the imaging system which are controlled by a processor control.

The antireflection coating and type of crystal in the modulator depend on the laser wavelength, which may vary depending on the application. The electro optic modulator is driven by a driver which can be computer controlled. On sending the trigger signal, which is preferably a voltage or power signal, to the electro optic modulator from the driver the polarization state of the laser beam is shifted from horizontal to vertical polarization or vice versa. Vertical and horizontal polarizations are also called as S and P polarizations. By changing the polarization, the beam will be transmitted or deflected by the polarizing beam splitter or a polarizer or prism, thus acting like a high speed shutter and controlling the pulse. The deflected or transmitted beam can be used for processing, but generally the transmitted beam is used for laser processing, and the deflected beam is blocked by the beam blocking means. FIG. 2 shows the working mechanism of the electro optic modulator for pulse control. The pulsed laser from the ultrafast laser oscillator 1 preferably has a repletion rate of 5 MHz to 200 MHz and passes through an electro optic modulator 3C at S or P-polarization state. The electro optic modulator 3C is driven by a driver 3D, which is controlled by a computer 3E. A fraction of the laser beam 21 (less than 1% of energy) is deflected by a partial coated mirror 3A on to a photo detector 3B which is placed before the electro optic modulator as shown in the FIG. 2 to obtain the signal from beam 21A and to synchronize the on/off of the electro optic modulator 3C to avoid any clipping of the laser pulse 21C. Due to the fast rise time of the electro optic modulator 3C, the polarization state of any individual pulse or a group of pulses can be shifted by 90 degrees to S or P polarization state respectively. On passing through the polarizing beam splitter 3F which is of the type plate polarizing beam splitter or cube polarizing beam splitter or polarizer or prism, the S and P polarized laser pulses are deflected at different angles. One of the beams 21D can be blocked by a beam blocking means 3G and the other beam 22 can be used for laser processing. FIG. 3 shows the electro optic modulator for changing the polarization state of alternative pulses, and FIG. 4 shows the electro optic modulator changing the polarization state of the group of pulses. Thus by using electro optic modulator 3C in combination with a polarizing beam splitter 3F for controlling the laser pulse from ultrafast laser oscillator, the repletion rate of the laser pulse can be reduced to any required value as shown in FIG. 3 to minimize/eliminate the cumulative heating effect and improve the machining quality. Alternatively, a time gap is provided between groups of laser pulses to minimize the cumulative heating effect and to improve the machining quality as sown in FIG. 4. Further the electro optic modulator serves as a shutter to enable or disable the ultrafast laser pulse when required. Further the electro optic modulator can be used to vary the pulse energy by varying the voltage applied to the electro optic modulator from the driver. Precise control of pulse energy/intensity control is essential for varying the ablated feature size, selective material removal etc. A central processor controller controls the photo detector, the driver of the electro optic modulator, the imaging system, the XYZ stages and the galvanometer scanner as shown in FIG. 5.

Controlling the Laser Pulse by Acousto Optic Modulator

The acousto optic modulator may have the following specifications, and it may be used to control the laser pulse from the ultrafast laser oscillator to minimize or eliminate the cumulative heating effect and to improve the machining quality.

Figure 6:
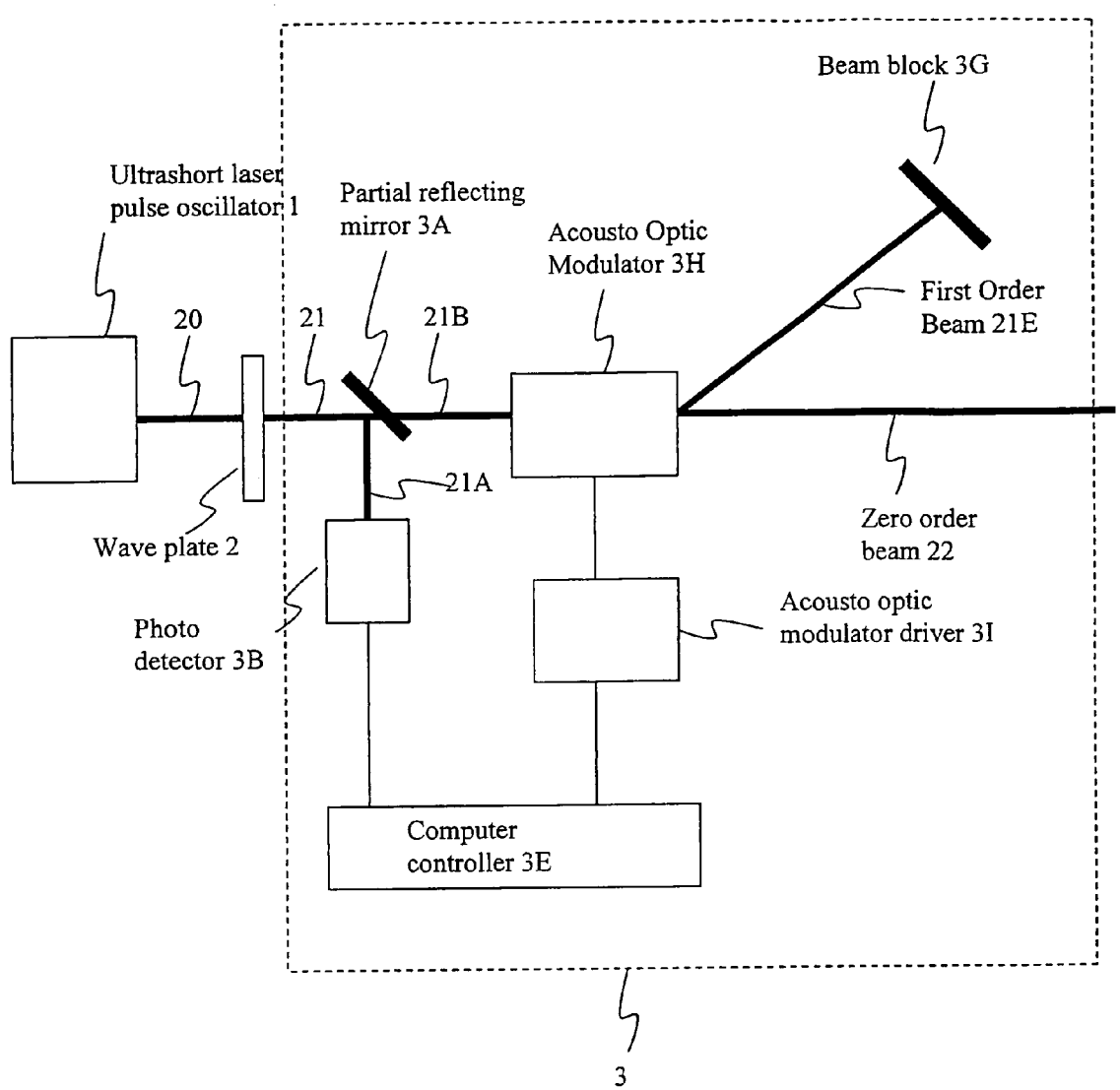
FIG. 6 is an illustration showing the apparatus to modulate the ultrafast laser pulse from the oscillator using acousto optic modulator.

Rise time: 5-100 ns
Efficiency: 70-95%
Clear aperture: 0.5-5 mm
Centre frequency/carrier frequency: 25 MHz to 300 MHz The laser pulse from the ultrafast laser oscillator passes through the acousto optic Modulator (AOM) 3H, which is driven by a driver 3I, as shown in FIG. 6. The ultrafast laser is split into first order beam 21E and zero order beams 22, where the first order beam 21E is deflected at an angle called the Bragg angle to the zero order beam 22 as shown in FIG. 6. The zero order beam 22 will have the same polarization state of the input beam 21B and the first order beam will have a polarization state ninety degrees to the input beam 21B. Thus, if the input beam 21B is P polarized, the zero order beam 22 will be P polarized, and first order beam 21E will be S polarized and vice versa.

The Bragg angle is given by

θ=λf/v, where λ is the wavelength of the incident laser beam, f is the center frequency/carrier frequency of the AOM and v is the velocity of the acoustic wave propagation in the in the acoustic crystal.

The first order beam 21E or zero order beam 22 can be used for laser processing, and the other beam is blocked by the beam blocker 3G.

Figure 7:
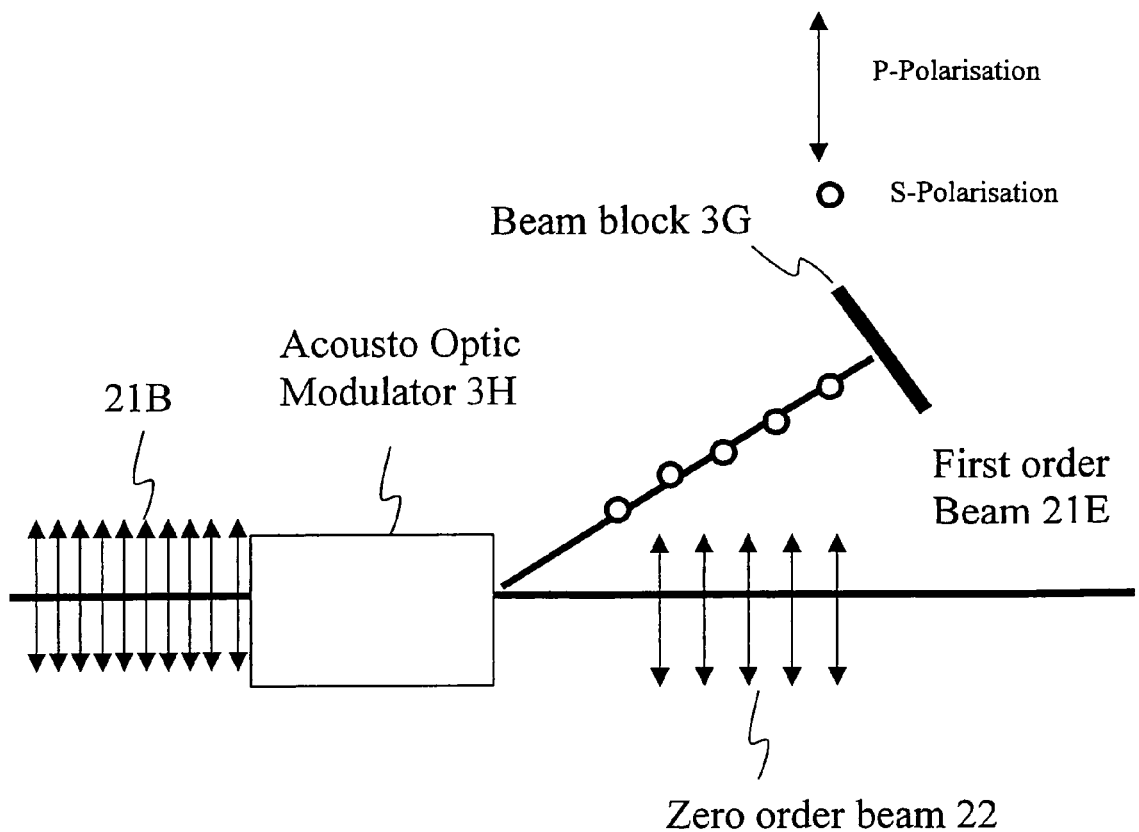
FIG. 7 is an illustration showing the mechanism of eliminating the successive ultrafast laser pulse to reduce the repetition rate by using acousto optic modulator.
Figure 8:
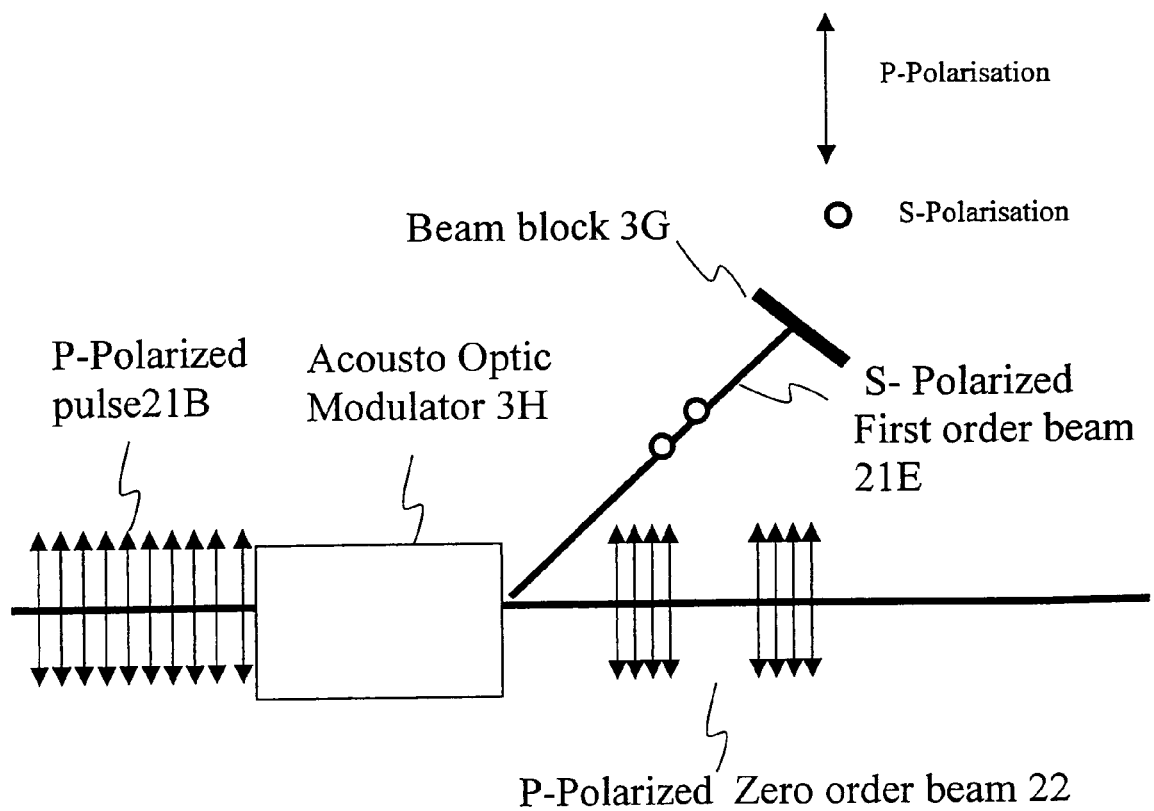
FIG. 8 is an illustration showing the introduction of a time gap between groups of laser pulses using acousto optic modulator.
Figure 9:
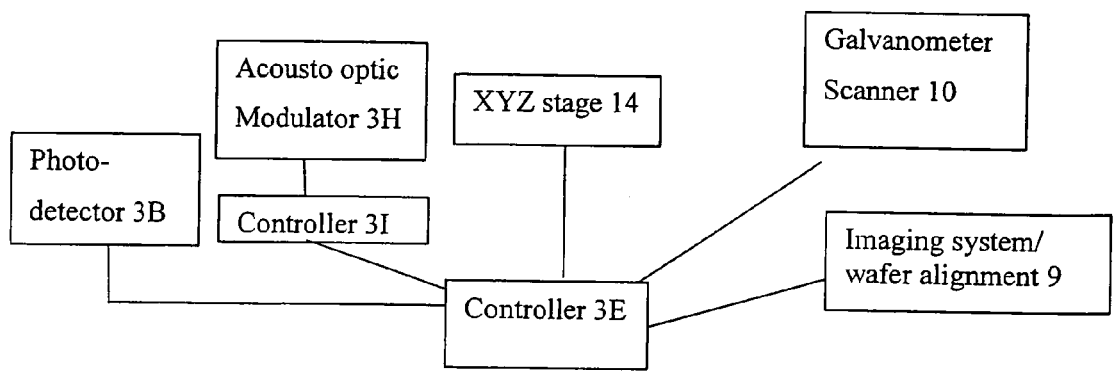
FIG. 9 is an illustration showing the control mechanism including a photo detector, acousto optic modulator, XYZ translation stage, galvanometer scanner and the imaging system which are controlled by a processor control.

The ultrafast laser beam is a spectrum and the spectral width increases with the reduction in pulse width. On passing through the AOM 3H different wavelength in the laser spectrum will have a different Bragg angle. Hence the first order beam 21E will disperse resulting in an elliptical shape of the laser beam, which will result in a poor beam quality and hence the machined feature quality. The dispersion effect reduces with the increase in the pulse width due to shorter spectral width and vice versa. Using the first or zero order beams for material processing may not be a problem above 1 ps pulse with but below 1 ps pulse width there will be serious deterioration of the beam quality. The zero order beam 22 has no dispersive effect and can be used for processing, and the first order beam 21E can be blocked by beam blocking means 3G as sown in FIG. 6. By using an acousto optic modulator for controlling the laser pulse from ultrafast laser oscillator the repletion rate of the laser pulse can be reduced as shown in FIG. 7 to minimize/eliminate the cumulative heating effect and improve the machining quality. Alternatively, a time gap between groups of laser pulses can be provided to minimize the cumulative heating effect and to improve the machining quality as shown in FIG. 8. Further the acousto optic modulator serves as a shutter to turn on and off the ultrafast laser pulse when required. Also the electro optic modulator can be used to vary the pulse energy by varying the power applied to the acousto optic modulator from the driver. Precise control of pulse energy/intensity control is essential for varying the ablated feature size, selective material removal etc. A central processor controller controls the photo detector, driver of Acousto optic modulator, imaging system, XYZ stages and the galvanometer scanner as shown in FIG. 9.

Figure 10:
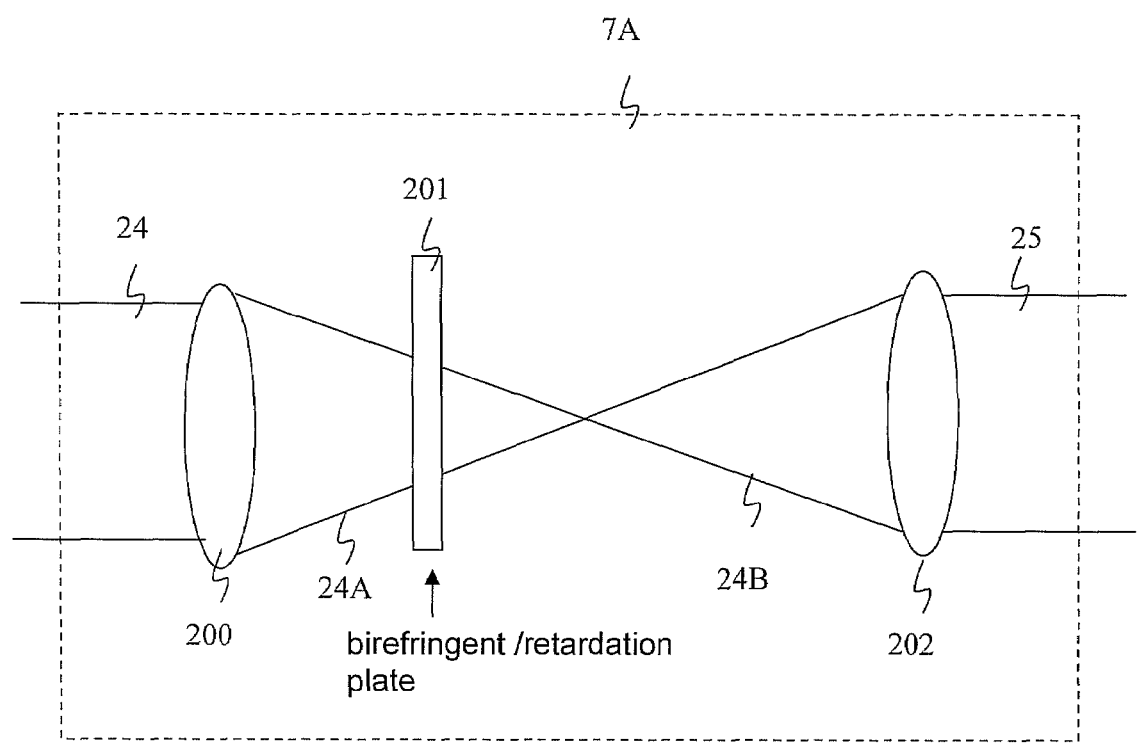
FIG. 10 is an illustration showing a polarization conversion module to change the polarization state of the ultrafast laser beam.

Polarization Conversion Module:

The laser beam 24 is passed through a polarization conversion module 7A to change the polarization state of the laser beam along the axis of the laser beam profile. In FIG. 10, a novel yet simple technique is proposed for radial polarization modulation. The first biconvex lens 200 focuses the collimated laser beam into a tightly convergent beam 24A. As illustrated in FIG. 10, light rays of a convergent beam travel different optical path lengths when they transmit to a birefringent/retardation plate plate 201. The retardation plate 201 can be a half-wave plate or a quarter-wave plate. The light rays at the central part of the beam travel a shorter distance than those at the edge. Consequently, the polarization state is partially or completely modulated into radial, depending on the beam convergence and properties of the birefringent plate. The laser beam 24B is collimated by the lens 202. The lens 200 and 202 can be of the positive type or negative type lens and may be combined like a telescope. It was found that the polarization converted beam by the polarization conversion module significantly improves the machining quality and throughput. By converting the polarization state of the beam by the polarization convertion module 7A there are significant advantages. There is a significant reduction in debris generated due to ablation. There is a reduction in the focused beam spot size by 10-30% compared to linear or circular polarization states. There is an increase in the machining efficiency by 10-30% compared to linear or circular polarization states.

Figure 10A:
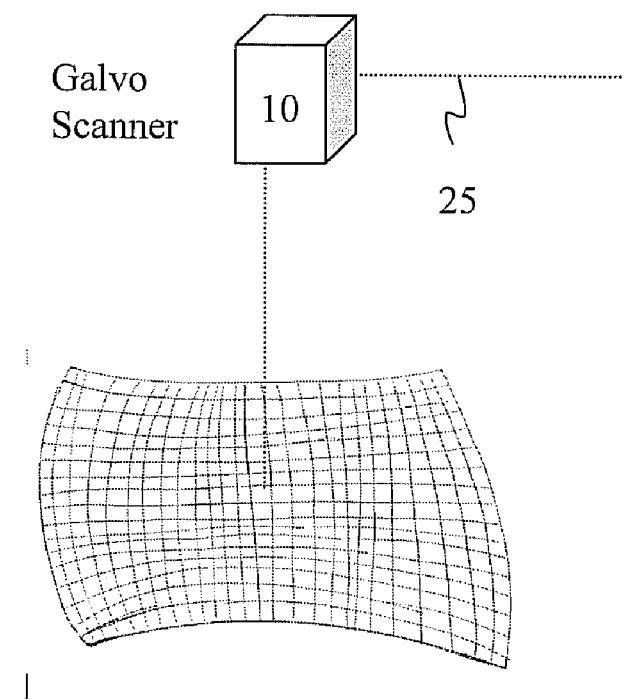
FIG. 10A is an illustration showing a galvo scanner with pillow shaped distortion field.
Figure 10B:
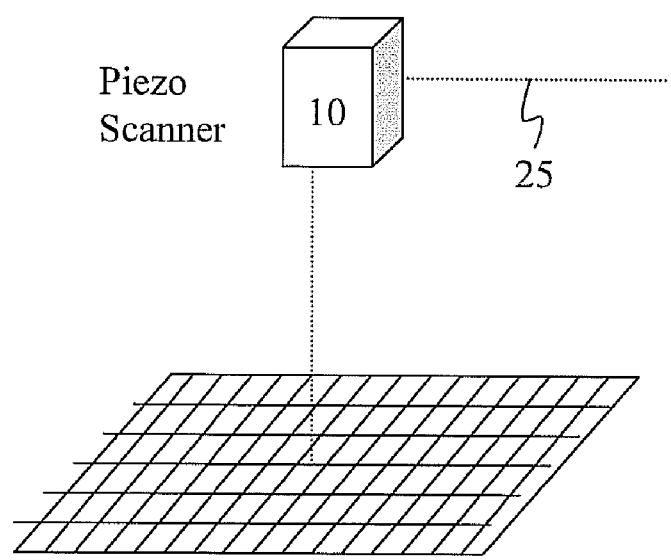
FIG. 10B is an illustration showing a piezo scanner that avoids pillow shaped distortion field.

Scanning Module:

The scanning module 10 can be a galvo scanner or a piezo scanner. The scanning module scans the laser beam in two axes. A piezo scanner is preferred over a galvo scanner. There is a higher scanning speed and hence improved machining quality and efficiency. There is higher positioning accuracy and resolution. There is also a minimization of the cumulative heating effect due to higher scanning speed. Lastly, there is a common pivot point, and field distortion at the image plane is avoided. Please see FIGS. 10A and 10B. Hence, it does not require compensation software to eliminate the distortion.

Figure 11:
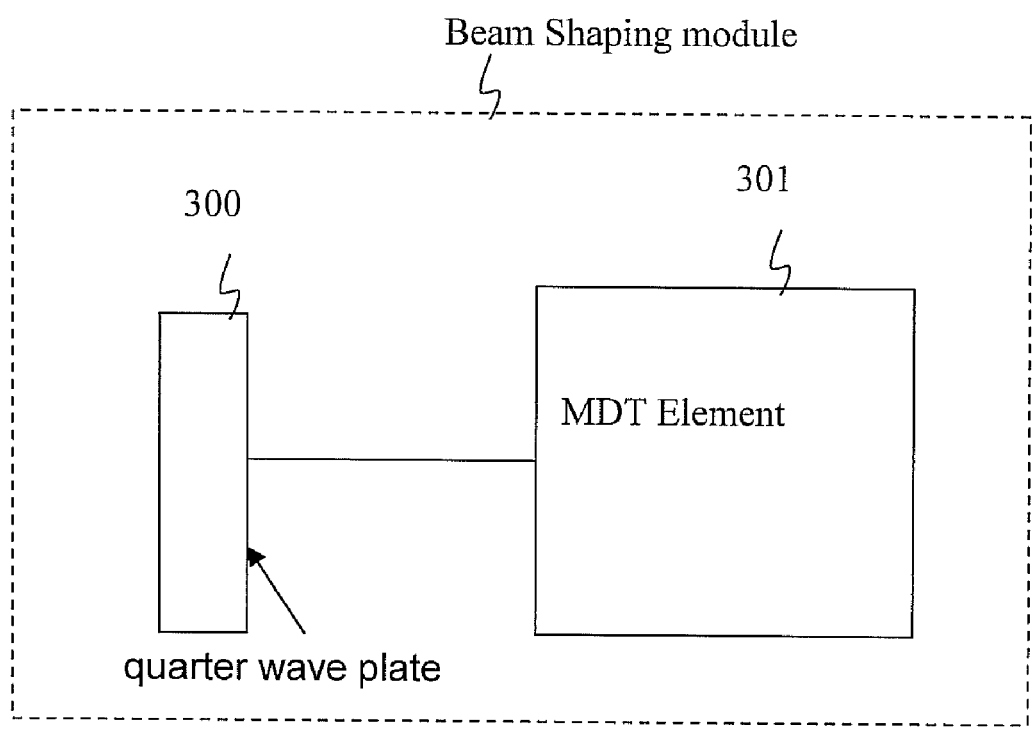
FIG. 11 is an illustration showing a beam shaping module to change the profile of ultrafast laser beam.

Beam Shaping Module:

The beam shaping module is introduced to change the profile of the laser beam to a hat top or any other profile required. The beam shaping module is as shown in FIG. 11, and it preferably includes a quarter wave plate 300 and a MDT crystal 301. The MDT element is relatively cheap compared to beam shapers, consisting of several micro lens or diffractive optics. The MDT element is based on the phenomenon of internal conical reflection, and the resultant beam profile depends on the diameter and wavelength of the incoming beam and the length of the MDT element. By varying the diameter and length of the MDT element, different beam profiles are possible. The beam shaping module can be placed after the polarization conversion module, or it can be absent depending on the application.

Using Gas or Liquid Assist:

Use of assisted gas or liquid plays a vital role in ultrafast laser machining. It provides a mechanical force to eject the melt from the cut zone, and it cools the cut zone by forced conversion.

By using assisted gas or liquid for ablating a feature using a laser pulse from an ultrafast laser oscillator, the heat diffusion time is reduced due to the cooling effect of gas or liquid. Due to the reduction in the heat diffusion time it is possible to minimize the cumulative heating effect and to improve the ablated feature quality even at relatively high repletion rates. Thus, by using assisted gas or liquid, the minimal/no cumulative heating effect and quality machined feature can be obtained at a repetition rate 2-10 times higher than at non gas assisted process. Also the efficiency and overall quality of the machining process can be improved by using assisted gas or liquid due to the interaction of the gas or liquid jet with the work piece. Also the gas or liquid assist the machining process by efficiently carrying the debris from the cutting channel. These assisted gases or liquid are delivered by single or multiple nozzles 12 at a pressure, which is determined by the substrate material, depth of cut, the type of nozzle used, distance of the nozzle 12 from the work piece 12 etc. In case of assisted gas, compressed gas from a gas tank is fed into the nozzle through a gas inlet where a pressure gauge is set. The gas pressure can be adjusted through a regulator installed upstream of the gas inlet. In the case of liquid assisted cutting water or any other appropriate liquid is mixed with compressed air and sprayed on the substrate at the required pressure. The liquid pressure and ratio of liquid to air is controlled by a regulator. Generally the gas or liquid nozzles are positioned as close to the work piece as possible for minimizing the gas or liquid usage and for improving the machining quality and efficiency. Some examples of the gas used to minimize the cumulative heating effect, improving the ablated feature quality and improve the machining efficiency are air, HFC, SF6, Nitrogen, Oxygen, argon, CF4, Helium, or a chlorofluorocarbon or halocarbon gas. The commonly used liquid assists are water, methanol, iso-propanol alcohol etc. A lower viscosity liquid will improve the cutting quality and efficiency.

Scanning the Beam at High Speed:

By scanning the laser beam fast enough, each laser pulse irradiates a different spot. The scanning speed required to minimize the cumulative heating effect and increase the ablated feature quality depends on the focused spot size d, pulse energy Ep, scanning speed S, ablation threshold of material Eth and repletion rate of the system R.

The distance between the two consecutive spot D is given by $$D = S/R$$

Figure 12:
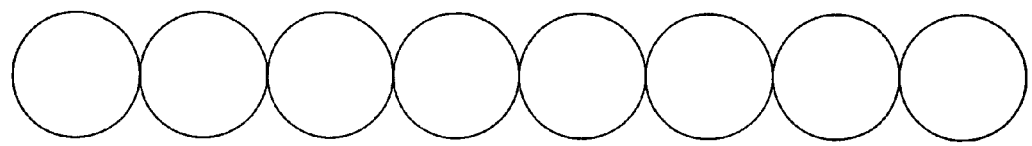
FIG. 12 is an illustration showing the 0% overlap between consecutive ablated laser spots.
Figure 12A:
FIG. 12A is an illustration showing the edge quality of the ablated feature with 0% overlap between consecutive ablated laser spots.
Figure 13:
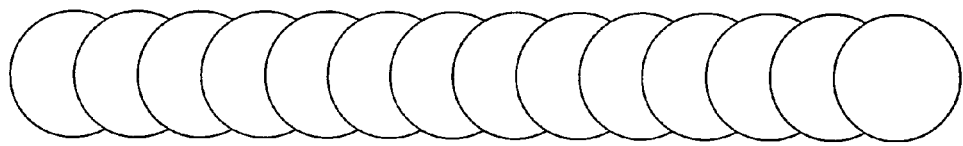
FIG. 13 is an illustration showing the 50% overlap between consecutive ablated laser spots.
Figure 13A:
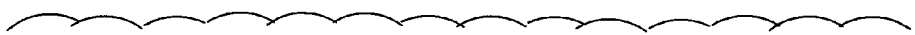
FIG. 13A is an illustration showing the edge quality of the ablated feature with 50% overlap between consecutive ablated laser spots.
Figure 14:
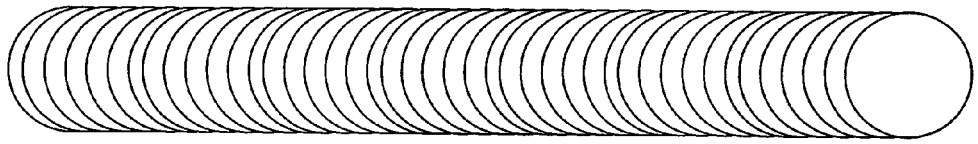
FIG. 14 is an illustration showing the edge quality of the ablated feature with 90% overlap between consecutive ablated laser spots.

For example, if the repletion rate of the system is 1 MHz and the scanning speed of 1000 mm/sec, the distance between the consecutive pulses is 1 μm. The overlap between the pulses Op will determine the edge quality of the ablated feature. The ablated feature Fd size can be as big as 2-3 times the focused spot size and as small as 1/20th focused spot size depending on the laser fluence/pulse energy and the material threshold. So if the ablated feature size Fd is 1 µm, the consecutive pulse will have 0% overlap as shown in FIG. 12. Hence, there will be no cumulative heating effect present. But the edge quality will be bad, if there is 0% overlap between the pulses as shown in FIG. 12A. Generally to obtain a uniform edge quality, 50% or more overlap between the consecutive pulses is required. So in order to obtain 50% overlap, as shown in FIG. 13, the scanning speed S should be reduced to 500 mm/sec. The resultant edge quality of the machined feature is as shown in FIG. 13A. The overlap between the pulses Op can be increased to 90% as sown in FIG. 14 by reducing the scanning speed to 100 mm/sec. The cumulative heating effect increases with the increase in the pulse to pulse overlap Op, but an overlap of 90% to 50% generally has minimal cumulative heating effect and better machining quality for most applications. Generally the maximum scanning speed of a commercially available galvanometer scanner is 3000-7000 mm/sec. Since it is very difficult to reduce the repletion rate of the of the laser pulse from the ultrafast laser oscillator below a certain limit due to the required resonator length, the scanning speed of the laser beam plays a very important role in improving the machining quality and reducing the cumulative heating effect. The repetition rate of the system Ro for a given pulse to pulse overlap Op is given by:

$$Ro = S/(1-Op) \times Fd$$

For example, if the maximum scanning speed of the galvanometer scanner is 5000 mm/sec and the ablated feature size is 1 µm, the repletion rate of the pulse from ultrafast laser oscillator R can be as high as 50 Mhz for a pulse to pulse overlap Op of 90%. But if the maximum scanning speed of the galvonometer scanner is 1000 mm/sec, then for the same condition of 90% overlap the repletion rate R can be only 10 MHz. Thus, the cumulative heating effect and the ablated feature quality can be controlled by varying the scanning speed for a given repletion rate of the system, the pulse to pulse overlap and ablated feature size.

Depending on the depth of the feature required the laser beam will be scanned along the same path few times at the optimal scanning speed. This mechanism of scanning at high speed is applicable for cutting a slot or via drilling by trepanning.

Machining feature size below the focused spot size

In addition, the present invention is capable of producing a feature size of less than one twentieth of the focused spot size of the ultrafast pulse laser beam. This can be achieved by precisely controlling the laser threshold fluence slightly above the ablation threshold of the material and by precisely controlling the number of pulses and the duration between the pulses (minimizing or eliminating the cumulative heating effect) using the pulse modulation means disclosed in this invention.

Figure 15:
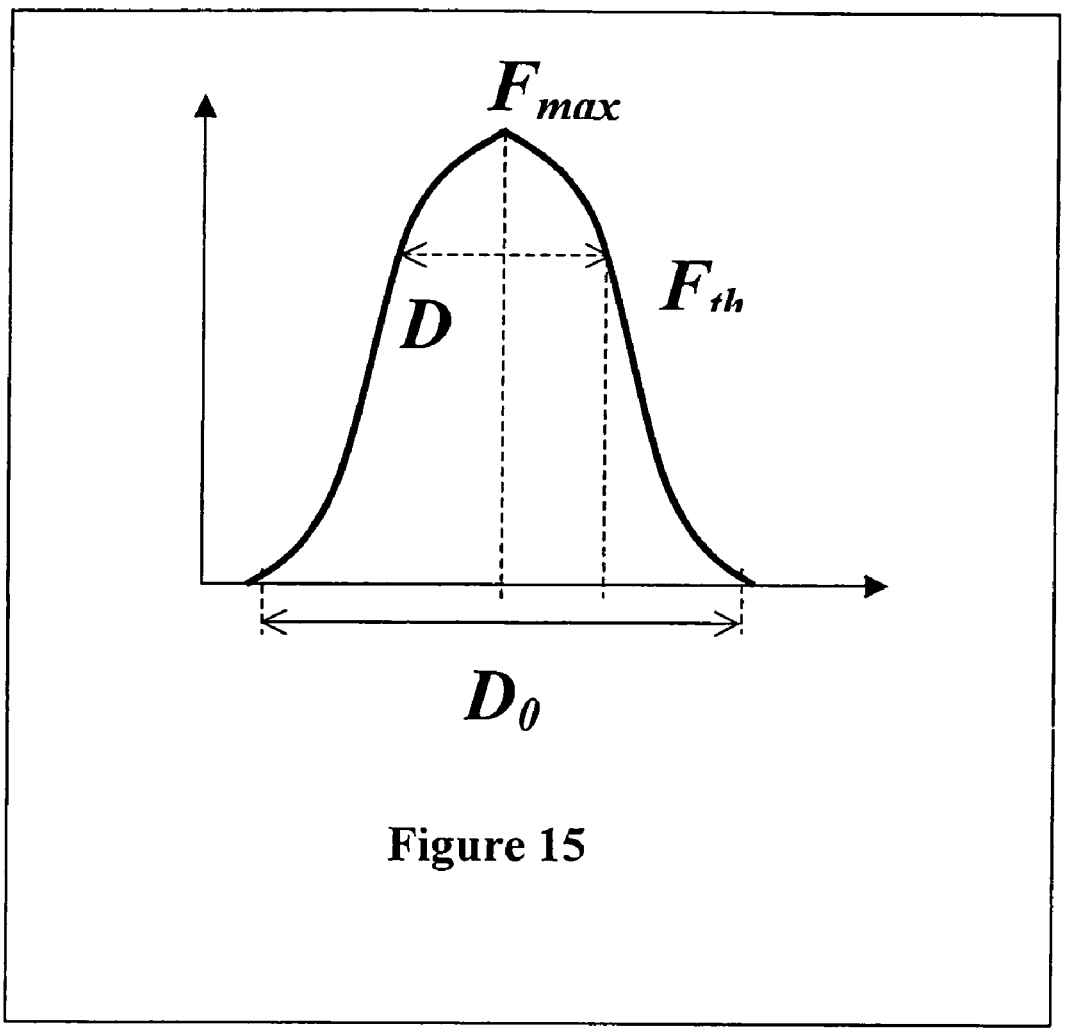
FIG. 15 is an illustration showing the Gaussian energy distribution of machining spots.

The energy distribution of machining spot follows a Gaussian profile, as sown in FIG. 15, thus, the fluence at any location of the spot F (x,y) can be calculated from the maximum fluence Fmax by $F(x,y) = F_{max} \exp(-2(x^2+y^2)/(D/2)^2)$, where D denotes the diameter of laser spot. Since the threshold Fth is precisely defined at ultrafast pulse width, only the portion of laser spot where $f(x,y) \geq F_{th}$ will induce material removal. The above equation can be used to predict the size of the ablated feature. To obtain a feature size 1/10th of the spot size, the maximum fluence Fmax must be controlled just 2% higher than the ablation threshold of the target material.

Also it is difficult to obtain a feature far below the focused spot size of the laser beam due to the cumulative heating effect, which causes the damaged site to enlarge and hence difficult to machine sub micron and nano structures. As disclosed in this application, the cumulative heating effect can be minimized or eliminated by controlling the distance between the successive pulses or by varying the scanning speed of the laser beam or by using gas or liquid assist or any combination of the above. In addition, the stability of the laser pulse from the ultrafast laser oscillator plays a vital role in machining feature of a desired size with repeatability and precision. For every 1% variation in the laser fluence the feature size varies by 16% (which can be derived from a Gaussian equation). The pulse to pulse energy from the ultrafast laser oscillator is very stable due to fewer optical components, diode pumping, sealed optical components and environmentally (temperature, pressure) stabilization. Hence the laser fluence variation is very minimal, which enables it to generate micro and nano scale features with high repeatability and precision.

Pulse Energy:

Pulse energy plays a vital role in micro and nano processing with high quality.

Pulse energy is given by $Pe = P_{avg}/R$, where $P_{avg}$ is the average power of the laser and R is the repletion rate.

The pulse energy required to ablate a feature depends mainly on the threshold fluence of the material, feature size, maximum depth of the feature required.

Maximum Depth:

The maximum depth that can be generated for a given focused spot size of the laser beam depends on the pulse energy. As the ablated feature becomes deeper, it is difficult to remove the ablated material from the hole and hence the ablated material absorbs the energy of the subsequent pulse. Thus, the depth limit exhibits a logarithmic dependence on the pulse energy.

Feature Size Repeatability:

The uncertainty in the feature size obtained will depend on the number of pulses required to ablate the required feature. Due to the topography generated and debris deposited in the crater by the ablation of the first pulse, the absorption of the successive pulse is different due to the defects generated in the previous pulse, scattering of the laser beam etc. Due to the above mechanism the ablation threshold of the successive pulse may vary. The uncertainty in the diameter of ablated feature increases with the increase in the number of laser pulses. The greater the number of pulses required for a given feature, the greater will be the uncertainty of feature size and hence the repeatability. Hence it is advantageous to use higher pulse energy and a lower number of pulses to ablate a required feature. An optimal pulse energy and number of pulse should be determined to ablate a feature to a required specification.

Quality of the Ablated Feature:

Due to the change in the topography of the substrate and the debris deposited in the crater by the initial pulse, the successive pulse will scatter and hence there is a change in the threshold fluence of the successive pulse. Higher pulse energy generates sufficient pressure for ejecting the debris out of the carter and hence the successive pulse can interact with the fresh substrate. This results in an improved top surface and an inner wall quality of the ablated feature.

Wavelength of the Laser Beam

In ultrafast laser processing, the wavelength of the laser beam does not have a major impact on the threshold fluence of the material as in case of short pulse ablation in micron and nanosecond pulse width. Due to high peak power of the laser due to short pulse width, the protons are generated by the laser beam to start the ablation process rather than being generated from the substrate. Hence absorption of the material at different wavelengths does not have a major influence in its threshold fluence. Hence, a laser beam having the fundamental frequency will have a wavelength preferably in the range of 700 nm to 1200 nm. It will have a higher cutting efficiency than the second harmonic frequency (frequency doubled) of 350 nm-600 nm for a given focused spot size due to the higher average power from the ultrafast laser oscillator at the fundamental frequency. The fundamental laser frequency power will be 50% to 300% higher than the second harmonic frequency in the range of 233 nm to 400 nm, and hence it will have 50% to 300% higher material removal throughput.

Similarly, the laser beam having the second harmonic frequency having the wavelength preferably in the range of 350 nm to 600 nm, will have a higher cutting efficiency compared to third harmonic frequency (Frequency tripled) due to the greater average power from the ultrafast laser oscillator at second harmonic frequency. The second harmonic laser frequency power will be 50% to 300% higher than the third harmonic frequency in the range of 233 nm to 400 nm, and hence it will have 50% to 300% higher material removal throughput.

Figure 16:
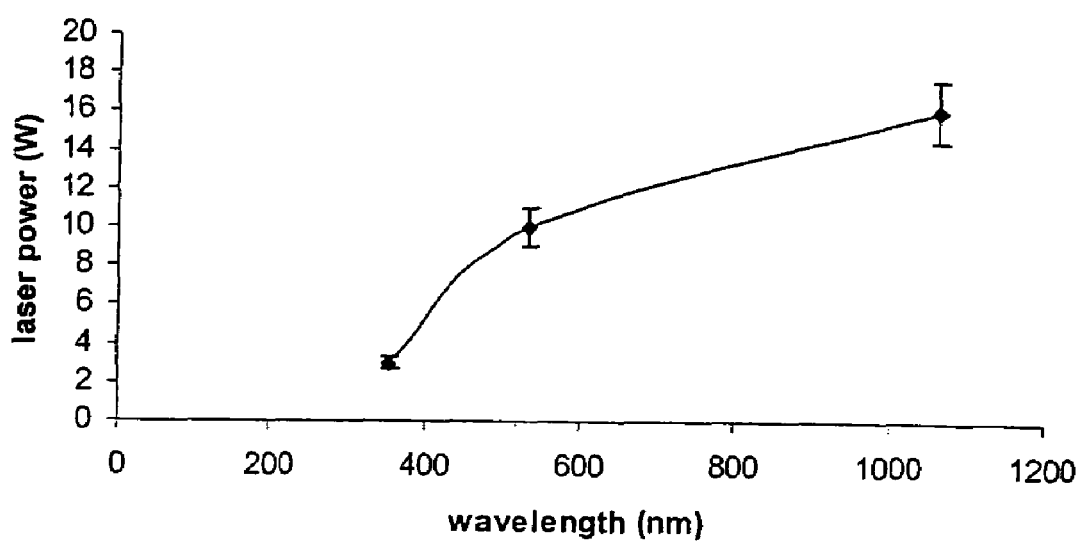
FIG. 16 is a graph showing the average laser power at different laser wavelengths for a typical picosecond laser oscillator.

For example, the average power output at the fundamental wavelength of 1064 nm is 16 W for a picosecond laser, such as the Model UPL-20 Lumera laser, and the average power of second harmonic frequency at 532 nm wavelength is 10 W (FCS-532-Lumeral laser) and the third harmonic frequency at 355 nm wavelength is 3 W (FCS-355-Lumera laser). Typical increases in laser power with the laser wavelength for an ultrafast laser oscillator of a picosecond pulse width is as shown in FIG. 16.

The stability of the laser beam will deteriorate with the reduction in wavelength by frequency doubling and tripling, due to the increase in the optical components and the sensitivity of the frequency doubling and tripling crystal to environmental factors such as temperature. This deterioration in the stability of the laser beam will lead to relatively poor pulse to pulse energy stability and beam pointing stability. Hence, repeatability in feature size and position accuracy may deteriorate compared to the fundamental frequency from the ultrafast laser oscillator by frequency doubling and tripling.

Hence, the fundamental frequency will have better stability in terms of pulse to pulse energy and pointing stability compared to second harmonic frequency. Similarly, the second harmonic frequency will have better stability in terms of pulse to pulse energy and pointing stability compared to third harmonic frequency. Also the cost of the system may increase by frequency doubling and tripling due to the addition of more optical components.

In spite of the drawbacks of using frequency doubled and tripled laser pulse, some applications may demand the use of shorter wavelength to achieve smaller feature size and in sensitive material processing.

Selective Material Removal

Figure 17:
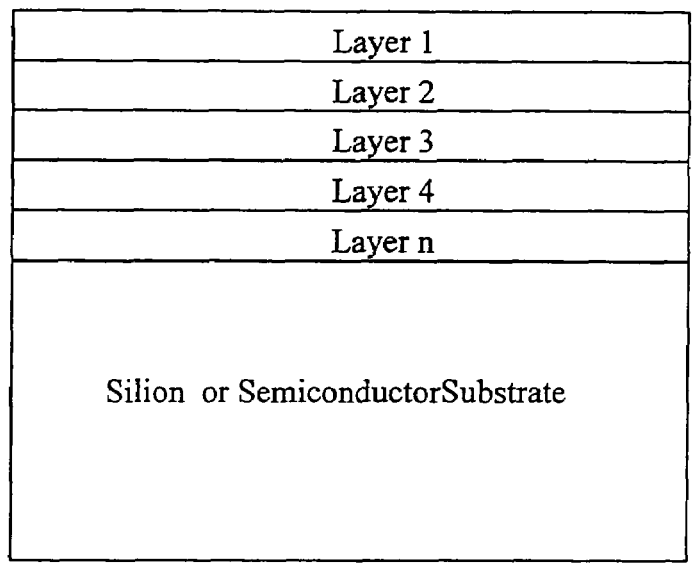
FIG. 17 is an illustration of a multiple layer structure of a semiconductor wafer.
Figure 18:
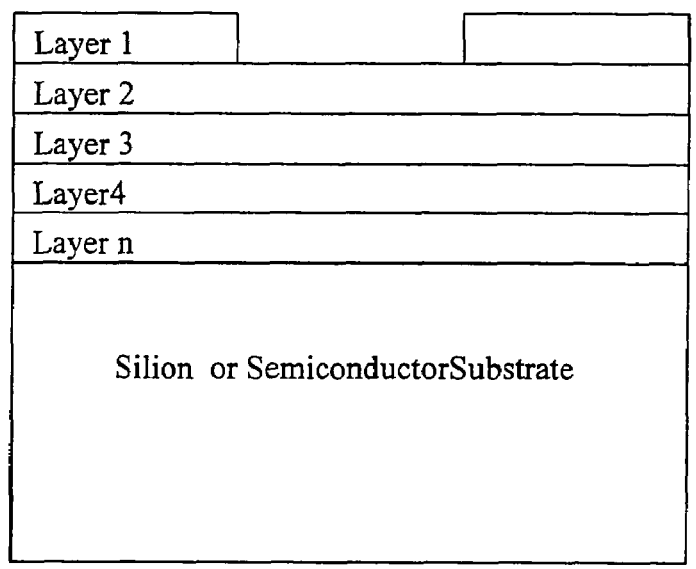
FIG. 18 is an illustration of selective removal of a layer 1 without ablating the underlying layer2 using a laser beam from an ultrafast laser oscillator.
Figure 19:
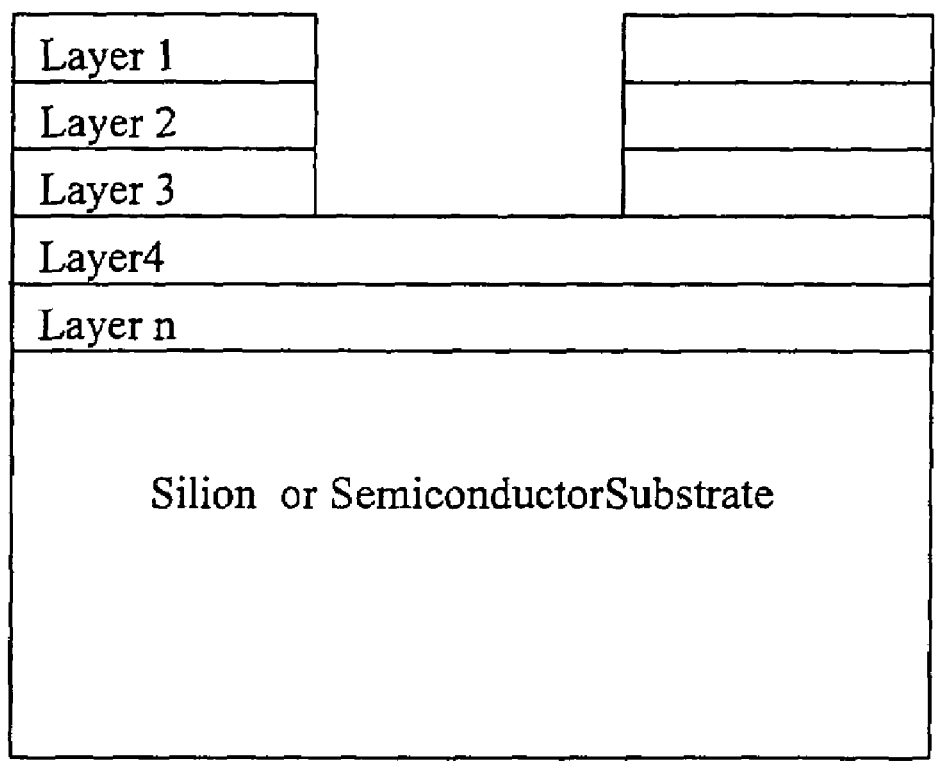
FIG. 19 is an illustration of selective removal of multiple layers 1, 2, 3 without ablating the underlying layer 4 using a laser beam from an ultrafast laser oscillator.

The method and apparatus of the present invention is capable of selective remove material using ultrafast laser pulse from the oscillator. In ultrafast laser processing the threshold fluence of the material is clearly defined. Hence by controlling the pulsed laser fluence, material with lower threshold fluence can be selectively removed without ablating the underlying material of higher threshold fluence. A structure, illustrated in FIG. 17, includes multiple layers of different materials. Hence each layer has different threshold fluence depending on the composition of the material. If the layer 1 has the threshold fluence lower than the underlying layer 2, then layer 1 can be ablated/removed without ablating/ machining the underlying layer 2 by controlling the laser fluence as shown in FIG. 18. The selectively ablated area can be of any desired shape depending on the application. The laser fluence is controlled above the threshold fluence of layer 1 and lower than the threshold fluence of the underlying layer 2. By this mechanism, the laser pulse will not have sufficient energy to ablate/machine the layer 2, but it will have sufficient energy to ablate the layer 1. For example, silicon has a lower threshold fluence than metal such as copper, gold and aluminum. Hence, a silicon layer can be removed without damaging the underlying metal layer such as copper, gold or aluminum. Similarly a few layers of material can be removed as shown in the FIG. 19 without affecting the underlying layer. The overlying layer can be removed layer by layer or a few layers together by controlling the laser fluence. Each layer can vary in thickness from a few micrometers to a few nanometers. The laser fluence of the material depends on the material, the number of pulses at each scan point, scanning speed, focused spot size, repletion rate of the laser pulse, laser wavelength and the pulse width. Depending on the required feature shape (such as via, slot etc) and the size of the feature, the threshold fluence of the material at different layers should be determined.

It is not imperative that the entire overlying layer have a lower threshold fluence then the underlying layer (which should not be ablated). For precise machining, only the layer immediately above the underlying layer where the ablation/ machining should stop, need to have the threshold fluence lowers than the underlying layer. For example, if layer 3 has a higher threshold fluence than layer 5, but layer 4 has lower threshold fluence than layer 5. By controlling the laser fluence, layer 3 is first removed before completely removing the layer 4 in the successive cycle.

Via-Interconnects

In addition, the method and apparatus of the present invention can be utilized for drilling an interconnect via on multilayer printed circuit boards or semiconductor wafers and to ameliorate the aforesaid deficiencies of the prior art by using an ultrafast pulse generated directly from the laser oscillator.

Figure 20:
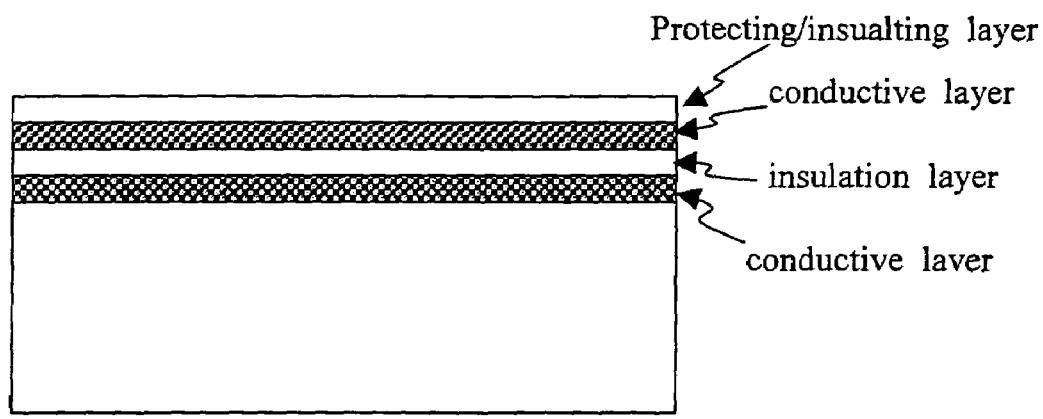
FIG. 20A is an illustration of a multilayer semiconductor wafer showing the protective, insulating and conductive layers.
FIG. 20B is an illustration showing a via channel drilled through the insulating layer 1, 2 and conductive layer 1 without ablating the underlying conductive layer 2 using a laser beam from an ultrafast laser oscillator.
FIG. 20C is an illustration showing the via channel drilled through multiple insulating and conductive layers without ablating the underlying conductive layer using a laser beam from an ultrafast laser oscillator.
FIG. 20D is an illustration showing a via channel drilled to connect different conductive layers in the same conductive surface using a laser beam from an ultrafast laser oscillator.
FIG. 20E is an illustration showing the interconnect formation fabricated with a metallization process to connect the conductive layers along the sidewall of a via channel.
FIG. 20F is an illustration showing the interconnect formation fabricated by filling a via channel with conductive metal to connect the conductive layers.
Figure 20:
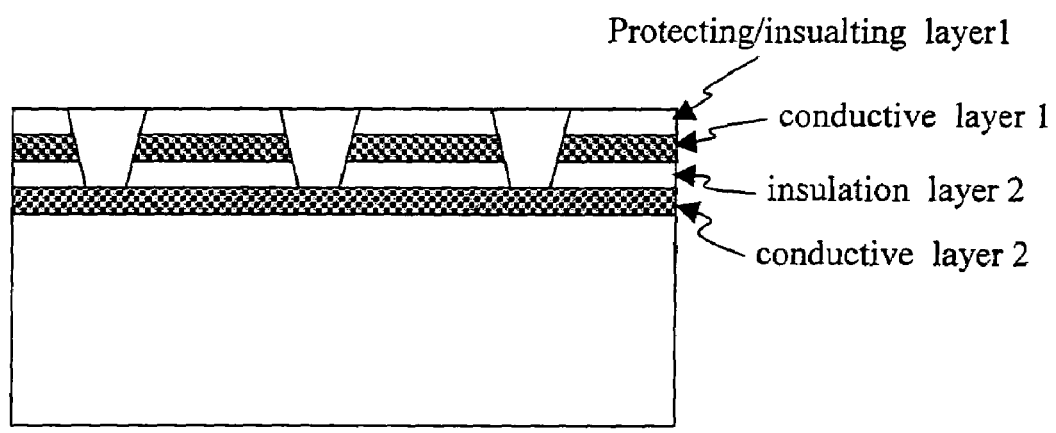
Figure 20:
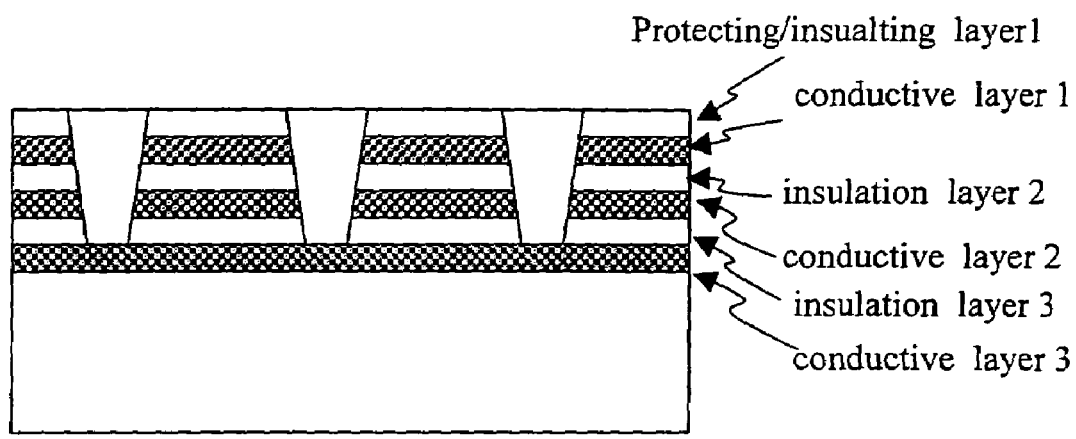
Figure 20:
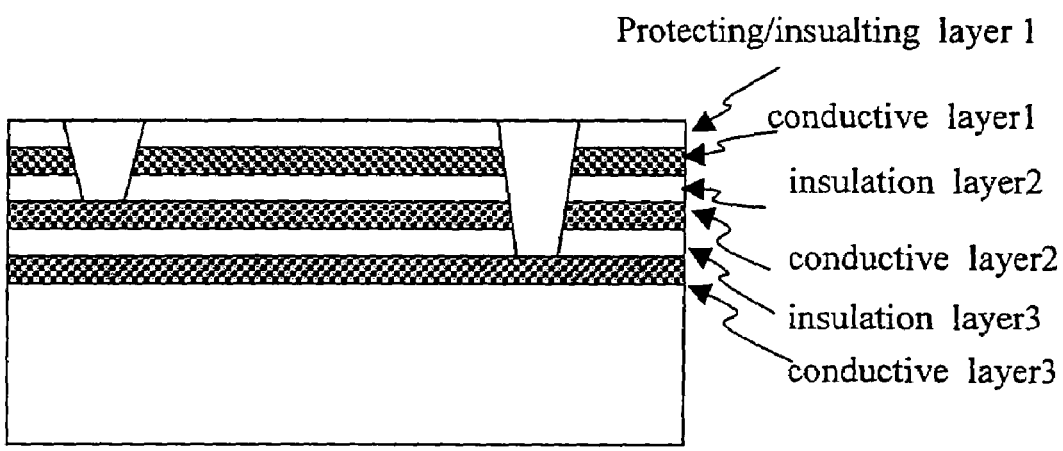
Figure 20:
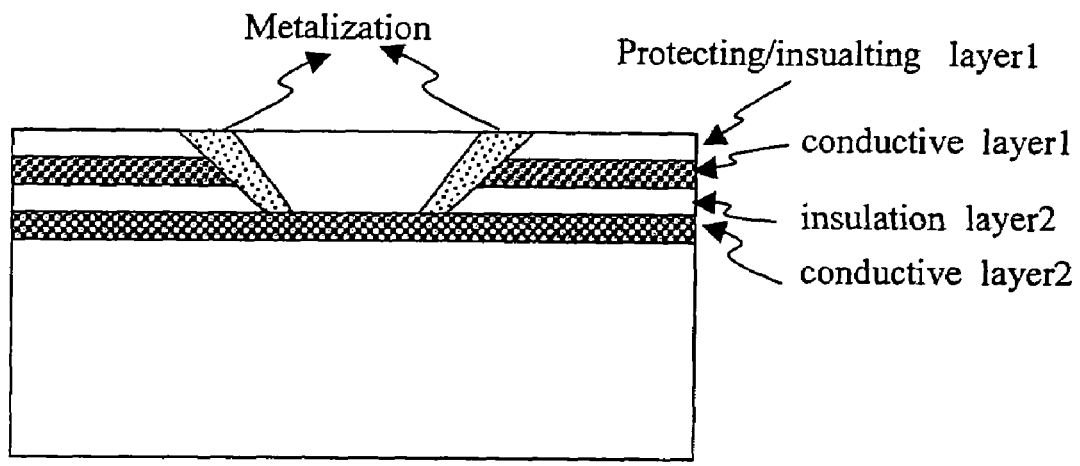
Figure 20:
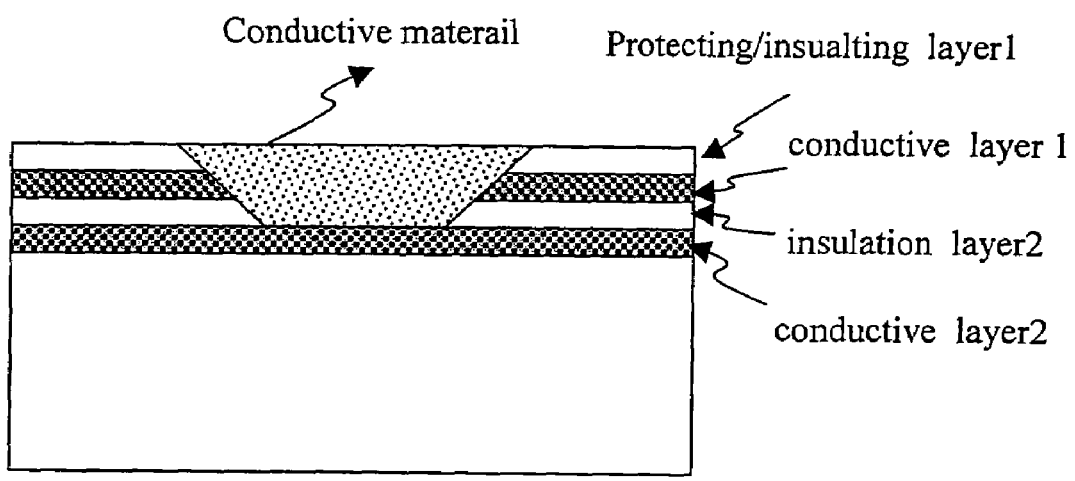

The semiconductor wafer where the interconnect via is to be formed includes a protective layer, an insulating layer and conductive layers as shown in FIG. 20A. As shown in FIG. 20B blind via holes are drilled through the protective or insulator layer 1 and through the conductive plate/layer 1 and insulating layer 2, causing minimal or no damage to the underlying conductive layer 2. The insulating layer can be dielectric, glass or any other insulating material. The protective/insulating layer at the top surface of the wafer may or may not be present depending on the application. A via has a smaller diameter at the lower portion of the via compared to the upper portion as shown in the FIG. 20B. A via sidewall angle may range from 89 degrees to 1 degree depending on the depth and diameter of via (top and bottom via diameter required). Also via holes can be formed between more than 2 conductive layers as shown in FIG. 20C. Here via holes are drilled between conductive layer 1 and conductive layer 3. Also different layers can be connected on the same multi layer printed circuit board or semiconductor wafer by drilling via holes as shown in FIG. 20D. The number of layers though which a via hole is drilled can vary depending on the application. Via interconnects are then formed by filling via holes formed between conductive layers/plane with conductive material as shown in FIG. 20E and 20F. This process is also called metallization. Via holes are filled along the sidewalls (type1) or completely filled (type-2) as shown in FIG. 20E and 20F. Sidewall angle is critical for filling via holes with conductive material without voids. The slope enables smooth flow of conductive material in via holes. In laser processing as the depth of the via channel increases, barrel shape channels are formed. These barrel shape holes result in voids when filling the holes with conductive material, and it is not acceptable for the formation of an interconnect. This barrel formation can be avoided by the method and apparatus disclosed in the present application. The method and apparatus disclosed in this application can be used to produce both round and slotted blind vias of single and multiple depths. Following are some of the advantages of forming interconnect via holes using the method and apparatus disclosed in this invention. Micro cracks are minimized or eliminated. A recast layer along the via sidewalls is minimized or eliminated to avoid formation of voids during metallization of the via holes. It is possible to selectively drill a via hole through multiple layers without damaging the underlying layer by controlling the threshold fluence of the laser beam. FIG. 21 shows the difficulty in stopping the ablation precisely at selected layer using nanosecond and amplified ultrafast laser compared to the ultrafast laser system disclosed in the present application. The present invention makes it easy to remove surface debris by minimal post process cleaning, since the debris does not adhere to the surface strongly. The present invention can generate via holes in micron and nano scale, which is demanded by current and future integrated circuits. Minimal or no damage is caused to adjacent structure due to heat dissipation. Via depth can be controlled very precisely. A very high repeatability of via holes in terms of diameter and depth is possible. FIG. 22 shows the poor repeatability of via holes formed by nanosecond laser and amplified ultrafast laser compared to the high repeatability of via holes formed by the ultrafast laser system disclosed in this application. Moreover, barrel shape via can be eliminated.

The invention has been described with reference to exemplary embodiments. However, it will be readily apparent to those skilled in the art that it is possible to embody the invention in specific forms other than those of the embodiments described above. This may be done without departing from the spirit of the invention. The exemplary embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A laser machining apparatus for via drilling and selective material removal in a semiconductor wafer or workpiece having an ultrafast laser pulse emitted directly from an ultrafast laser oscillator, comprising:
   an emitter configured to emit a pulsed laser beam from a diode pumped or CW laser pumped solid state ultrafast laser oscillator without amplification in addition to the amplification provided by the ultrafast laser oscillator;
   an external controller configured to control the laser pulse, to minimize the cumulative heating effect and to improve the machining quality;
   a varying unit configured to control the diameter of the laser beam along at least one axis;
   a scanner configured to scan the laser beam in two axes; and
   a focusing unit configured to focus the pulsed laser beam on to the work piece or semiconductor wafer;
   wherein a via is drilled or material is selectively removed from the work piece or semiconductor wafer;
   wherein the ultrafast laser oscillator includes a fiber oscillator amplifier of a repetition rate greater than 1 MHZ.

2. The apparatus of claim 1, wherein the ultrafast laser oscillator includes a diode pumped or CW laser pumped solid state femtosecond laser oscillator or diode pumped or CW laser pumped picosecond laser oscillator or diode pumped or CW laser pumped ultrashort laser oscillator depending on the pulse width of the laser beam generated.

3. The apparatus of claim 1,
   wherein the laser source includes a diode pumped or CW laser pumped solid state ultrafast laser oscillator preferably of pulse width ranging from 1 fs to 100 ps, pulse energy 1 nanojoule-100 microjoule and the pulse repletion rate in a range of 1 MHZ to 400 MHZ;
   wherein the repetition rate can be reduced and pulse energy can be increased by increasing a cavity length inside the ultrafast laser oscillator;
   wherein the cumulative heating effect can be minimized and machining quality improved with a reduction in the repetition rate of the laser pulse from the ultrafast laser oscillator.

4. The apparatus of claim 3;
   wherein the wavelength of the laser beam from the ultrafast laser oscillator is preferably a fundamental frequency of 700 nm-1200 nm wavelength or a second harmonic of the fundamental frequency of 350 nm-600 nm wavelength or a third harmonic of the fundamental frequency of 233 nm-400 nm wavelength;
      wherein the laser beam from the ultrafast laser oscillator preferably has the following characteristics;
         a pointing stability of the beam is less than 100 μrad/ 100 nm;
         a laser stability less than ±1%
         laser noise less than ±1%;
         laser beam divergence of less than 4 mradian; and
         a spatial mode $TEM_{00}$ of $M^2$ less than 2.

5. The apparatus of claim 1, which further includes a polarization converter including;
   a polarization plate that is a component of a telescopic module to change the polarization state of the laser beam along the axis of the beam;
   wherein the laser beam at the central part travels a shorter distance in the polarization plate than the laser beam at the edge due to the divergence or convergence of the laser beam;
   wherein the polarization state of the laser beam is different, along the axis, at different portions of the laser beam profile due to a different distance traveled through the polarization plate;
   wherein the telescopic module is a keplerian telescope, having two positive lenses or a Galilean telescope, having a positive and negative lens;
   wherein the polarization plate is selected from a group including a half wave plate or a quarter wave plate or retardation plate or bireflingent plate or a combination of half wave and quarter wave plate;
   wherein the polarization state of the resultant laser beam from the polarization converter can be a partly or completely radially polarized.

6. The apparatus of claim 5 which further includes a polarization module for providing a resultant polarization state of the laser beam that results in;
   a reduction in the focused machined feature size and spot size of the laser beam compared to linear or circularly polarized laser beam by 5-40%;
   minimizes the debris surrounding the ablated area and hence the quality compared to linearly or circularly polarized laser beams; and increases the machining efficiency or ablation rate by 10-50% compared to linearly or circularly polarized laser beams.

7. The apparatus of claim 1, wherein the pulsed laser beam from the ultrafast laser oscillator is modulatd by an electro optic modulator or an acousto optic modulator, which are driven by respective drivers to minimize the cumulative heating effect and to improve the ablated feature quality.

8. The apparatus of claim 7, wherein the electro optic modulator and acousto optic modulator serve as a laser shutter to turn on and off the laser pulse from the ultrafast laser oscillator when required.

9. The apparatus of claim 7, which further includes a photo detector that is placed before the electro optic modulator or acousto optic modulator to obtain a signal and to synchronize the on/off signal to the electro optic modulator to avoid any clipping of the laser pulse.

10. The apparatus of claim 7, wherein the repletion rate of the laser pulse from ultrafast laser oscillator is reduced by modulating the laser pulse by electro optic modulator or acousto optic modulator to minimize or eliminate the cumulative heating effect and improve the machining quality.

11. The apparatus of claim 7, wherein a time gap is provided between groups of laser pulses from the ultrafast laser oscillator resulting from modulating the laser pulse by electro optic modulator or acousto optic modulator to minimize the cumulative heating effect and improve the machining quality.

12. The apparatus of claim 7, wherein by modulating the laser pulse ultrafast laser oscillator by the electro optic modulator or the acousto optic modulator, the laser pulse can be transmitted or blocked when required.

13. The apparatus of claim 7, wherein the pulse energy of the laser beam from the ultrafast laser oscillator is controlled by varying the power applied to the electro optic modulator or acousto optic modulator from the electro optic driver or acousto optic driver respectively.

14. The apparatus of claim 7,
wherein the electro optic modulator is used in combination with a polarizing beam splitter or polarizer or prism for modulating the laser pulse; the electro optic modulator includes pockets cells or a Q-switch or a pulse picker;
wherein the electro optic modulator has the following characteristics;
a short rise time in the range of 20 ns to 10 ps;
an energy/power loss less than 10%; and
a clear aperture diameter of 1-10 mm;
wherein an antireflection coating and crystal in the modulator depend on the laser wavelength, pulse width and energy;
wherein the electro optic modulator is driven by a driver which is computer controlled;
wherein the electro optic modulator is driven by the driver by sending a trigger signal, which is a power or voltage signal, which shifts the polarization state of the laser beam on passing through the electro optic modulator from horizontal to vertical polarization or vice versa.

15. The apparatus of claim 14;
wherein changing the polarization the pulse in the electro optic modulator will be transmitted or deflected by the polarizing beam splitter or a polarizer or prism, thus acting like a high speed shutter and modulating the laser pulse from the ultrafast laser oscillator;
wherein the transmitted beam can be used for ultrafast pulsed laser processing and the deflected beam is blocked by the beam blocker and vice versa.

16. The apparatus of claim 7, wherein the electro optic modulator can change the polarization state of any individual pulse or a group of pulses from the ultrafast laser oscillator by 90 degrees to horizontal or vertical polarization state depending on the polarization state of the input pulse.

17. The apparatus of claim 7, wherein the acoustic optic modulator has the following characteristics;
a rise time of 5-100 ns;
an efficiency of 50-95%;
a clear aperture of 0.5-5 mm;
a center frequency/carrier frequency of 25 MHz to 300 MHz.

18. The apparatus of claim 7;
wherein the acousto optic modulator is driven by the driver by sending a trigger signal, which is preferably a power or voltage signal, splits the ultrafast laser beam into first order and zero order beams, where the first order beam is deflected at the Bragg angle with respect to the zero order beam;
wherein the zero order beam has the same polarization state of the input beam and the first order beam will have a polarization state 90 degrees to the input beam;
wherein the first order or zero order beam can be used for laser processing and the other beam is blocked by a beam blocker, thus acting like a high speed shutter and modulating the laser pulse from the ultrafast laser oscillator.

19. The apparatus of claim 18, wherein the zero order beam has no dispersive effect and used for material processing and the first order beam is blocked by a beam blocker.

20. The apparatus of claim 1, wherein the modulated ultrafast laser beam is expanded or reduced in beam diameter in one or two axis of the laser beam by a beam expander or reducer of a keplerian telescope, including two positive lenses or of a Galilean telescope, including positive and negative lenses.

21. The apparatus of claim 1, which further includes a beam quality improver including an Iris diaphragm.

22. The apparatus of claim 1, wherein a one axis or two axis galvanometer scanner or a piezo scanner scans the laser beam across the work piece or semiconductor wafer.

23. The apparatus of claim 1;
wherein the pulsed laser beam is focused on the substrate by the focus unit having an objective lens or telecentric or f-Theta lens or confocal microscopy lens or the like;
wherein the focus unit is positioned at a distance from the scanning mirror approximately equal to the front focal length of the focusing unit and the work piece is positioned at approximately the back focal length of the focus unit.

24. The apparatus of claim 1, wherein the work piece/substrate is moved with respect to the laser beam by a translation table.

25. The apparatus of claim 1, which further includes a pulse modulator, a two axis galvanometer or a piezo scanner and a translation table that are controlled by a central processor controller.

26. The apparatus of claim 1, further comprises a scanning strategy controller for controlling at least one of the incident laser beam power, pulse repetition rate, duration between successive pulse or a group of pulses and a galvanometer or piezo scanning speed during the machining on the work piece/substrate.

27. The apparatus of claim 1, wherein the cumulative heating effect is minimized, machining quality is improved and machining speed is increased using a gas or liquid assist;
wherein the gas is applied at a pressure through a nozzle;
wherein the liquid is mixed with compressed air and applied at a pressure through a nozzle;

wherein single or multiple nozzles may be used depending on the application;

wherein the gas or liquid nozzle is placed close to the work piece surface;

wherein the gas assist may be air, HFC, $SF_6$, Nitrogen, Oxygen, argon, $CF_4$, Helium, or a chlorofluorocarbon or halocarbon gas; and the liquid assist may be water, methanol or iso-propanol alcohol.

28. The apparatus of claim 1, further comprises an imaging unit to align the work piece to the focused laser beam and to monitor the machining process.

29. The apparatus of claim 1, wherein the work piece/substrate is comprised of monocrystalline silicon or polycrystalline silicon or metals or insulating material or dielectric material glass or silica or semiconductor material or polymer, or a combination of the above.

30. The apparatus of claim 1, wherein a spatial machining resolution of less than one-twentieth of a cross-sectional diameter of the pulsed laser beam from the ultrafast laser oscillator in a focused state at the surface of the work piece can be achieved.

31. The apparatus of claim 1, wherein the cumulative heating effect is minimized, quality of machined feature is improved and machining efficiency is improved by controlling the scanning speed of a laser beam from the ultrafast laser oscillator of pulse repetition rate 1 MHZ to 400 MHZ;

wherein the optimal scanning speed to minimize the cumulative heating effect, improve the cutting efficiency and improve the machining quality depend on the repletion rate of the laser beam, the ablated feature size and a gas or liquid assist used.

32. The apparatus of claim 1, further comprises a unit configured to improve the repeatability of feature size and the quality of the machined feature by controlling the pulse energy and number of pulse required to ablate the required feature by laser pulse from the ultrafast laser oscillator of pulse repetition rate 1 MHZ to 400 MHZ; wherein a higher pulse energy and lower number of pulses at each scan point improves the repeatability of feature size and machining quality.

33. The apparatus of claim 1 further comprises a unit configured to improve the ablation efficiency and feature size repeatability;

wherein a pulsed laser beam from the ultrafast laser oscillator having the fundamental frequency having the wavelength in the range of 700 nm to 1200 nm, will have 50% to 200% higher cutting efficiency than the second harmonic frequency of 350 nm-600 nm from the ultrafast laser oscillator due to the higher laser power; and wherein a pulsed laser second harmonic frequency from the ultrafast laser oscillator having the wavelength in the range of 350 nm to 600 nm, will have 50% to 200% higher cutting efficiency compared to third harmonic frequency from the ultrafast laser oscillator of 233 nm-400 nm due to the first laser power.

34. The apparatus of claim 33;

wherein the fundamental frequency from ultrafast laser oscillator has better laser stability position accuracy and feature size repeatability than the second harmonic frequency from an ultrafast laser oscillator due to increased optical components and sensitivity of the frequency conversion crystal; and wherein the second harmonic frequency from the ultrafast laser oscillator has better laser stability, position accuracy and feature size repeatability than the third harmonic frequency from the ultrafast laser oscillator due to increased optical components and sensitivity of the frequency conversion crystals.

35. The apparatus of claim 1, wherein a selective material is removed for further semiconductor processing for connecting high density integrated circuits such as wire bonding, direct embedding, flip chip by precisely controlling the laser fluence.

36. A laser machining apparatus for via drilling and selective material removal in a semiconductor wafer or workpiece having an ultrafast laser pulse emitted directly from an ultrafast laser oscillator, comprising:

an emitter configured to emit a pulsed laser beam from a diode pumped or CW laser pumped solid state ultrafast laser oscillator without amplification in addition to the amplification provided by the ultrafast laser oscillator;

a controller configured to control the laser pulse, to minimize the cumulative heating effect and to improve the machining quality;

a varying unit configured to vary the diameter of the laser beam along at least one axis;

a scanner configured to scan the laser beam in two axes; and a focus unit configured to focus the pulsed laser beam onto the work piece or semiconductor wafer;

wherein a via is drilled or material is selectively removed from the work piece or semiconductor wafer;

wherein a one axis or two axis galvanometer scanner or a piezo scanner scans the laser beam across the work piece or semiconductor wafer;

wherein the piezo scanner avoids pillow shaped field distortion at the image field due to common pivot points;

wherein the ultrafast laser oscillator includes a fiber oscillator amplifier of a repetition rate greater than 1 MHZ.

37. A laser machining apparatus for via drilling and selective material removal in a semiconductor wafer or workpiece having an ultrafast laser pulse emitted directly from an ultrafast laser oscillator, comprising:

an emitter configured to emit a pulsed laser beam from a diode pumped or CW laser pumped solid state ultrafast laser oscillator without amplification in addition to the amplification provided by the ultrafast laser oscillator;

a controller configured to control the laser pulse, to minimize the cumulative heating effect and to improve the machining quality;

a varying unit configured to vary the diameter of the laser beam along at least one axis;

a scanner configured to scan the laser beam along two axes; and a focus unit configured to focus the pulsed laser beam on to the work piece or semiconductor wafer;

wherein a via is drilled or material is selectively removed from the work piece or semiconductor wafer;

which further comprises a beam shaper to change the shape of the beam profile at the focused spot size;

wherein the beam shaper includes a monoclinic double tungstate MDT element based on the phenomenon of internal conical reflection;

wherein the beam shaping is obtained by the combination of a quarter wave plate and the MDT element;

wherein the resultant beam profile depends on the diameter and wavelength on the incoming laser beam and the length of the MDT element;

wherein a flat top beam profile can be generated at the focal plane;

wherein the aspect ratio of the via holes can be increased;

wherein flat bottom via holes can be generated;

wherein the efficiency of beam shaping is high due to the transitive efficiency of the MDT material and minimal optical elements involved; and wherein the machining efficiency and quality of machining is improved due to beam Shaping;

wherein the ultrafast laser oscillator includes a fiber oscillator amplifier of a repetition rate greater than 1 MHZ.

38. An apparatus for ablating a feature smaller then the focused spot size of the pulsed laser beam from an ultrafast laser oscillator of a pulse repetition rate greater than 1 MHZ comprising:

an emitter configured to emit a pulsed laser beam from a solid state ultrfast laser oscillator without any amplification in addition to the amplification provided by the ultrafast laser oscillator;

a controller configured to control the laser threshold fluence slightly above the ablation threshold of the material;

a control unit configured to control the number of pulses and the duration between the pulses for minimizing or eliminating the cumulative heating effect, using a pulse modulator having an acousto optic device or an electro optic device;

wherein a spatial machining resolution of less than one-twentieth of a cross-sectional diameter of the pulsed laser beam in a focused state at the surface of the work piece is obtained;

wherein the ultrafast laser oscillator includes a fiber oscillator amplifier of a repetition rate greater than 1 MHZ.

* * * * *

UNITED STATES PATENT AND TRADEMARK OFFICE
CERTIFICATE OF CORRECTION

PATENT NO. : 7,528,342 B2 Page 1 of 1
APPLICATION NO. : 11/048704
DATED : May 5, 2009
INVENTOR(S) : T. Deshi It is certified that error appears in the above-identified patent and that said Letters Patent is hereby corrected as shown below:

On the cover page under Abstract, line 19, "a" should be deleted after the word "be".

At column 23, line 5, (claim 7, line 2), "modulatd" should be -- modulated --.

At column 27, line 5, (claim 37, line 38), "Shaping" should be -- shaping --.

Signed and Sealed this

Eighth Day of December, 2009

David J. Kappos
*Director of the United States Patent and Trademark Office*